(12) United States Patent
Miyauchi et al.

(10) Patent No.: US 7,055,089 B2
(45) Date of Patent: May 30, 2006

(54) DECODER AND DECODING METHOD

(75) Inventors: Toshiyuki Miyauchi, Tokyo (JP); Masayuki Hattori, Kanagawa (JP)

(73) Assignee: Sony Corporation, Tokyo (JP)

( * ) Notice: Subject to any disclaimer, the term of this patent is extended or adjusted under 35 U.S.C. 154(b) by 352 days.

(21) Appl. No.: 09/876,742

(22) Filed: Jun. 7, 2001

(65) Prior Publication Data

US 2002/0042901 A1   Apr. 11, 2002

(30) Foreign Application Priority Data

Jun. 8, 2000   (JP)   ............................. 2000-172676

(51) Int. Cl.
*H03M 13/03*   (2006.01)
(52) U.S. Cl. ....................... 714/794; 714/780
(58) Field of Classification Search ................ 714/780, 714/794, 795; 375/341
See application file for complete search history.

(56) References Cited

U.S. PATENT DOCUMENTS

| | | | | |
|---|---|---|---|---|
| 4,087,787 A | * | 5/1978 | Acampora ................... | 714/795 |
| 4,823,346 A | * | 4/1989 | Kobayashi et al. .......... | 714/794 |
| 5,933,462 A | * | 8/1999 | Viterbi et al. ............... | 375/341 |
| 6,304,996 B1 | * | 10/2001 | Van Stralen et al. ........ | 714/796 |
| 6,330,684 B1 | * | 12/2001 | Yamanaka et al. ............. | 714/1 |
| 6,392,572 B1 | * | 5/2002 | Shiu et al. .................... | 341/81 |

OTHER PUBLICATIONS

S. Benedetto, D. Divsalar, G. Montorsi, and F. Pollara, Soft-Output Decoding Algorithms in Iterative Decoding of Turbo Codes, TDA Progress Report 42-124, NASA Code 315-91-20-20-53.*

S. Benedetto, D. Divsalar, G. Montorsi, and F. Pollara, A Soft-Input Soft-Output Maximum A Posteriori (MAP) Module to Decod Parallel and Serial Concatenated Codes, TDA Progress Report 42-127, NASA Code 315-91-20-20-53.*

Liew, T.H.; Yeap, B.L.; Woodard J.; Hanzo, L.; Modified MAP algorithm for extended turbo BCH codes and turbo equalizers; First International Conference on 3G Mobile Communication Technologies (IEE Conf. Publ. No. 471), Mar. 27-29, 2000; pp.: 185-189.*

Yan Wang; Chi-Ying Tsui; Cheng, R.S.K.; A reduced complexity implementation of the Log-Map algorithm for turbo-codes decoding; Proceedings. 2000 IEEE International Conference on Acoustics, Speech, and Signal Processing; vol.: 5, Jun. 5-9, 2000, p.: 2.*

Stephen B. Wicker, "Error Control Systems for Digital Communication and Storage", Prentice-Hall, 1995.*

* cited by examiner

*Primary Examiner*—Joseph D. Torres
(74) *Attorney, Agent, or Firm*—Finnegan, Henderson, Farabow, Garrett & dunner L.L.P.

(57) ABSTRACT

A decoding system and method for providing relatively high likelihood of obtaining at least two paths of getting to each decoding state from at least three paths. The system and method also selects a maximum likelihood path from the two paths, where a log likelihood of getting to a state in the decoder is determined by a soft-input value encoded with a trellis so as to provide at least three paths for getting to the state.

13 Claims, 21 Drawing Sheets

DECODER AND DECODING METHOD

BACKGROUND OF THE INVENTION

1. Field of the Invention

This invention relates to a decoder and a decoding method adapted to soft-output decoding.

2. Related Background Art

There have been many studies in recent years for minimizing symbol error rates by obtaining soft-outputs for the decoded outputs of inner codes of concatenated codes or the outputs of recursive decoding operations using a recursive decoding method. There have also been studies for developing decoding methods that are adapted to producing soft-outputs. For example, Bahl, Cocke, Jelinek and Raviv, "Optimal decoding of linear codes for minimizing symbol error rates", IEEE Trans. Inf. Theory, vol. It-20, PP. 284–287, March 1974 describes an algorithm for minimizing symbol error rates when decoding predetermined codes such as convolutional codes. The algorithm will be referred to as BCJR algorithm hereinafter. The BCJR algorithm is designed to output not each symbol but the likelihood of each symbol as a result of decoding operation. Such an outputs is referred to as soft-output. The BCJR algorithm will be discussed below firstly by referring to FIG. 1. Assume that digital information is put into convolutional codes by encoder 201 of a transmitter (not shown), whose output is then input to a receiver (not shown) by way of a memoryless channel 202 having noises and decoded by decoder 203 of the receiver for observation.

The M states (transitional states) representing the contents of the shift registers of the encoder 201 are denoted by integer m(m=0, 1, . . . , M−1) and the state at time t is denoted by $S_t$. If information of k bits is input in a time slot, the input at time t is expressed by $i_t=(i_{t1}, i_{t2}, \ldots, i_{tk})$ and the input system is expressed by $I_1^T=(i_1, i_2, \ldots, i_T)$. If there is a transition from state m' to state m, the information bits corresponding to the transition are expressed by $i(m', m) = (i_1(m', m), i_2(m', m), \ldots, i_k(m', m))$. Additionally, if a code of n bits is output in a time slot, the output at time t is expressed by $x_t=(x_{t1}, x_{t2}, \ldots, x_{tn})$ and the output system is expressed by $X_1^T=(x_1, x_2, \ldots, x_T)$. If there is a transition from state m' to state m, the information bits corresponding to the transition are expressed by $x(m', m)=(x_1(m', m), x_2(m', m), \ldots, x_k(m', m))$.

The encoder 201 starts to produce convolutional codes at state $S_0=0$ and ends at state $S_T=0$ after outputting $X_1^T$. The inter-state transition probabilities $P_t(m|m')$ of the above encoder are defined by formula (1) below;

$$P_t(m|m')=Pr\{S_t=m|S_{t-1}=m'\} \quad (1)$$

where Pr {A|B} at the right side of the above equation represents the conditional probability with which A occurs under the conditions in which B occurs. The transition probabilities $P_t(m|m')$ are equal to the probability $Pr\{i_t=i\}$ that input $i_t$ at time t is equal to i when a transition from state m' to state m occurs with input i as shown by formula (2) below.

$$P_t(m|m')=Pr\{i_t=i\} \quad (2)$$

The memoryless channel 202 having noises receives $X_1^T$ as input and outputs $Y_1^T$. If a received value of n bits is output in a time slot, the output at time t is expressed by $y_t=(y_{t1}, y_{t2}, \ldots, y_{tk})$ and the output system is expressed by $Y_1^T=(y_1, y_2, \ldots, y_T)$. Then, the transition probabilities of the memoryless channel 202 having noises can be defined for all values of t ($1 \leq t \leq T$) by using the transition probability of each symbol, or $Pr\{y_j|x_j\}$.

$$Pr\{Y_1^t | X_1^t\} = \prod_{j=1}^{t} Pr\{y_j | x_j\} \quad (3)$$

Now, $\lambda_{tj}$ is defined by formula (4) below as the likelihood of input information at time t when $Y_1^T$ is received, or the soft-output to be obtained.

$$\lambda_{tj} = \frac{Pr\{i_{tj} = 1 | Y_1^T\}}{Pr\{i_{tj} = 0 | Y_1^T\}} \quad (4)$$

With the BCJR algorithm, probabilities $\alpha_t$, $\beta_t$ and $\gamma_t$ are defined respectively by means of formulas (5) through (7) below. Note that Pr {A;B} represents the probability with which both A and B occur.

$$\alpha_t(m)=Pr\{S_t=m; Y_1^T\} \quad (5)$$

$$\beta_t(m)=Pr\{Y_{t+1}^T|S_t=m\} \quad (6)$$

$$\gamma_t(m',m)=Pr\{S_t=m; y_t|S_{t-1}=m'\} \quad (7)$$

Now, the probabilities of $\alpha_t$, $\beta_t$ and $\gamma_t$ will be described by referring to FIG. 2, which is a trellis diagram, or a state transition diagram, of the encoder 201. Referring to FIG. 2, $\alpha_{t-1}$ corresponds to the passing probability of each state at time t−1 as computed on a time series basis from the state of starting the coding $S_0=0$ by using the received value and $\beta_t$ corresponds to the passing probability of each state at time t as computed on an inverse time series basis from the state of ending the coding $S_T=0$ by using the received value, while $\gamma_t$ corresponds to the reception probability of the output of each branch showing a transition from a state to another at time t as computed on the basis of the received value and the input probability.

Then, the soft-output $\lambda_{tj}$ is expressed in terms of the probabilities $\alpha_t$, $\beta_t$ and $\gamma_t$ in a manner as shown in formula (8) below.

$$\lambda_{tj} = \frac{\sum_{\substack{m',m \\ i_j(m',m)=1}} \alpha_t(m')\gamma_t(m', m)\beta_t(m)}{\sum_{\substack{m',m \\ i_j(m',m)=0}} \alpha_t(m')\gamma_t(m', m)\beta_t(m)} \quad (8)$$

Meanwhile, formula (9) below holds true for t=1, 2, . . . , T.

$$\alpha_t(m) = \sum_{m'=0}^{M-1} \alpha_{t-1}(m')\gamma_t(m', m) \quad (9)$$

where $\alpha_0(0)=1$, $\alpha_0(m)=0(m \neq 0)$

Similarly, formula (10) holds true also for t=1, 2, . . . , T.

$$\beta_t(m) = \sum_{m'=0}^{M-1} \beta_{t+1}(m')\gamma_{t+1}(m, m') \quad (10)$$

where $\beta_T(0)=1$, $\beta_T(m)=0 (m \neq 0)$

Finally, formula (10) holds true for $\gamma_t$.

$$\gamma_t(m', m) = \begin{cases} P_t(m|m') \cdot Pr\{y_t | x(m', m)\} \\ = Pr\{i_t = i(m', m)\} \cdot Pr\{y_t | x(m', m)\} \\ \quad : {}^*1 \\ 0 \quad : {}^*2 \end{cases} \quad (11)$$

: *1 ... when a transition occurs from $m'$ to $m$ with input $i$.

: *2 ... when no transition occurs from $m'$ to $m$ with input $i$.

Thus, for soft-output decoding, applying the BCJR algorithm, the decoder 203 determines the soft-output $\lambda_t$ by passing through the steps shown in FIG. 3, utilizing the above relationships.

More specifically, in Step S201, the decoder 203 computes the probabilities $\alpha_t$ (m) and $\gamma_t$ (m', m), using the formulas (9) and (11) above, each time it receives $y_t$.

Then, in Step S202, after receiving all the system $Y_1^T$, the decoder 203 computes the probability $\beta_t$ (m) of state m for all values of time t, using the formula (10) above.

Thereafter, in Step S203, the decoder 203 computes the soft-output $\lambda_t$ at each time t by substituting the values obtained in Steps S201 and S202 for the probabilities $\alpha_t$, $\beta_t$, and $\gamma_t$ in the formula (8) above.

With the above described processing steps, the decoder 203 can carry out the soft-output decoding, applying the BCJR algorithm.

However, the BCJR algorithm is accompanied by a problem that it involves a large volume of computational operations because it requires to directly hold probabilities as values to be used for computations and employ multiplications. As an attempt for reducing the volume of computational operations, Robertson, Villebrun and Hoeher, "A Comparison of Optimal and sub-optimal MAP decoding algorithms operating in the domain", IEEE Int. Conf. On Communications, pp. 1009–1013, June 1995, proposes Max-Log-MAP Algorithm and Log-MAP Algorithm (to be referred to as Max-Log-BCJR algorithm and Log-BCJR algorithm respectively hereinafter).

Firstly, Max-Log-BCJR algorithm will be discussed below. With the Max-Log-BCJR algorithm, the probabilities $\alpha_t$, $\beta_t$ and $\gamma_t$ are expressed in terms of natural logarithm so that the multiplications for determining the probabilities are replaced by a logarithmic addition as expressed by formula (12) below and the logarithmic addition is approximated by a logarithmic maximizing operation as expressed by formula (13) below. Note that in the formula (13), max (x, y) represents a function for selecting either x and y that has a larger value.

$$\log(e^x \cdot e^y) = x+y \quad (12)$$

$$\log(e^x + e^y) = \max(x,y) \quad (13)$$

For simplification, the natural logarithm is expressed by I and values $\alpha_t$, $\beta_t$, $\gamma_t$ and $\lambda_t$ are expressed respectively by $I\alpha_t$, $I\beta_t$, $I\gamma_t$ and $I\lambda_t$ in the domain of the natural logarithm as shown in formula (14) below.

$$\begin{cases} I\alpha_t(m) = \log(\alpha_t(m)) \\ I\beta_t(m) = \log(\beta_t(m)) \\ I\gamma_t(m) = \log(\gamma_t(m)) \\ I\lambda_t = \log\lambda_t \end{cases} \quad (14)$$

With the Max-Log-BCJR algorithm, the log likelihoods $I\alpha_t$, $I\beta_t$, $I\gamma_t$ are approximated by using formulas (15) through (17) below. Note that the maximum value max in state m' at the right side of the equation of (15) is determined in state m' showing a transition to state m. Similarly, the maximum value max in state m' at the right side of the equation of (16) is determined in state m' showing a transition to state m.

$$I\alpha_t(m) \cong \max_{m'}(I\alpha_{t-1}(m') + I\gamma_t(m', m)) \quad (15)$$

$$I\beta_t(m) \cong \max_{m'}(I\beta_{t+1}(m') + I\gamma_{t+1}(m, m')) \quad (16)$$

$$I\gamma_t(m',m) = \log(Pr\{i_t = i(m',m)\}) + \log(Pr\{y_t|x(m',m)\}) \quad (17)$$

With the Max-Log-BCJR algorithm, logarithmic soft-output $I\lambda_t$ is also approximated by using formula (18) below. Note that, in the equation of (18), the maximum value max of the first term at the right side is determined in state m' showing a transition to state m when "1" is input and the maximum value max of the second term at the right side of the above equation is determined in state m' showing a transition to state m when "0" is input.

$$I\lambda_{tj} \cong \max_{\substack{m',m \\ i_j(m',m)=1}} (I\alpha_{t-1}(m') + I\gamma_t(m', m) + I\beta_t(m)) - \quad (18)$$
$$\max_{\substack{m',m \\ i_j(m',m)=0}} (I\alpha_{t-1}(m') + I\gamma_t(m', m) + \beta_t(m))$$

Thus, for soft-output decoding, applying the Max-Log-BCJR algorithm, the decoder 203 determines soft-output $\lambda_t$ by passing through the steps shown in FIG. 4, utilizing the above relationships.

More specifically, in Step S211, the decoder 203 computes the log likelihoods $I\alpha_t$ (m) and $I\gamma_t$ (m', m), using the formulas (15) and (17) above, each time it receives $y_t$.

Then, in Step S212, after receiving all the system $Y_1^T$, the decoder 203 computes the log likelihood $I\beta_t$ (m) of state m for all values of time t, using the formula (16) above.

Thereafter, in Step S213, the decoder 203 computes the log soft-output $I\lambda_t$ at each time t by substituting the values obtained in Steps S211 and S212 for the log likelihoods $I\alpha_t$, $I\beta_t$ and $I\gamma_t$ in the formula (18) above.

With the above described processing steps, the decoder 203 can carry out the soft-output decoding, applying the Max-Log-BCJR algorithm.

As pointed out above, since the Max-Log-BCJR algorithm does not involve any multiplications, it can greatly reduce the volume of computational operations if compared with the BCJR algorithm.

Now, the Log-BCJR algorithm will be discussed below. The Log-BCJR algorithm is devised to improve the accuracy of approximation of the Max-Log-BCJR algorithm. More specifically, in the Log-BCJR algorithm, a correction term is added to the addition of probabilities of the formula (13) to obtain formula (19) below so that the sum of the addition of the formula (19) may represent a more accurate logarithmic value. The correction is referred to as log-sum correction hereinafter.

$$\log(e^x + e^y) = \max(x, y) + \log(1 + e^{-|x-y|}) \quad (19)$$

The logarithmic operation of the left side of the equation (19) is referred to as log-sum operation and, for the purpose of convenience, the operator of a log-sum operation is expressed by "#" as shown in formula (20) below (although it is expressed by "E" in the above paper) to follow the numeration system described in S. S. Pietrobon, "Implementation and performance of a turbo/MAP decoder, Int. J. Satellite Commun., vol. 16, pp. 23–46, January–February 1998". Then, the operator of a cumulative addition is expressed by "#Σ" as shown in formula (21) below (although it is expressed by "E" in the above paper).

$$x \# y = \log(e^x + e^y) \quad (20)$$

$$\# \sum_{i=0}^{M-1} x_i = ((\ldots((x_0 \# x_1) \# x_2) \ldots) \# x_{M-1}) \quad (21)$$

By using the operator, the log likelihoods $I\alpha_t$ and $I\beta_t$ and the log soft-output $I\lambda_t$ can be expressed respectively in a manner as shown in formulas (22) through (24) below. Since the log likelihood $I\gamma_t$ is expressed by the formula (17) above, it will not be described here any further.

$$I\alpha_t(m) = \# \sum_{m'=0}^{M-1} (I\alpha_{t-1}(m') + I\gamma_t(m', m)) \quad (22)$$

$$I\beta_t(m) = \# \sum_{m'=0}^{M-1} (I\beta_{t+1}(m') + I\gamma_{t+1}(m, m')) \quad (23)$$

$$I\lambda_{tj}(m) = \# \sum_{\substack{m',m \\ i_j(m',m)=1}} (I\alpha_{t-1}(m') + I\gamma_t(m', m) + I\beta_t(m)) - \quad (24)$$

$$\# \sum_{\substack{m',m \\ i_j(m',m)=0}} (I\alpha_{t-1}(m') + I\gamma_t(m', m) + I\beta_t(m))$$

Note that the cumulative addition of the log-sum operations in state m' at the right side of the equation of (22) is determined in state m' showing a transition to state m. Similarly, the cumulative addition of the log-sun operations in state m' at the right side of the equation of (23) is determined in state m' showing a transition to state m. In the equation of (24), the cumulative addition of the log-sum operations at the first term of the right side is determined in state m' showing a transition to state m when the input is "1" and the cumulative addition of the log-sum operations at the second term of the right side is determined in state m' showing a transition to state m when the input is "0".

Thus, for soft-output decoding, applying the Log-BCJR algorithm, the decoder 203 determines soft-output $\lambda_t$ by passing through the steps shown in FIG. 4, utilizing the above relationships.

More specifically, in Step S211, the decoder 203 computes the log likelihoods $I\alpha_t$ (m) and $I\gamma_t$ (m', m), using the formulas (22) and (17) above, each time it receives $y_t$.

Then, in Step S212, after receiving all the system $Y_1^T$, the decoder 203 computes the log likelihood $I\beta_t$ (m) of state m for all values of time t, using the formula (23) above.

Thereafter, in Step S213, the decoder 203 computes the log soft-output $I\lambda_t$ at each time t by substituting the values obtained in Steps S211 and S212 for the log likelihoods $I\alpha_t$, $I\beta_t$ and $I\gamma_t$ in the formula (24) above.

With the above described processing steps, the decoder 203 can carry out the soft-output decoding, applying the Log-BCJR algorithm. Since the correction term that is the second term at the right side of the above equation of (19) is expressed by a one-dimensional function relative to variable |x−y|, the decoder 203 can accurately calculate probabilities when the values of the second term are stored in advance in the form of a table in a ROM (Read-Only Memory).

By comparing the Log-BCJR algorithm with the Max-Log-BCJR algorithm, it will be seen that, while it entails an increased volume of arithmetic operations, it does not involve any multiplications and the output is simply the logarithmic value of the soft-output of the BCJR algorithm if the quantization error is disregarded.

Meanwhile, methods that can be used for correcting the above described log-sum includes the secondary approximation method of approximating the relationship with variable |x−y| by so-called secondary approximation and the interval division method of arbitrarily dividing variable |x−y| into intervals and assigning predetermined values to the respective intervals in addition to the above described method of preparing a table for the values of the correction term. These log-sum correction methods are developed by putting stress on the performance of the algorithm in terms of accurately determining the value of the correction term. However, they are accompanied by certain problems including a large circuit configuration and slow processing operations.

Therefore, studies are being made to develop high speed log-sum correction methods. Such methods include the linear approximation method of linearly approximating the relationship with variable |x−y| and/or the threshold value approximation method of determining values for predetermined intervals of variable |x−y| respectively by using predetermined threshold values.

The linear approximation method is designed to approximate function F=log {1+eÔ(−|x−y|)} as indicated by curve C in FIG. 5A by a linear function as indicated by straight line L. The straight line L in FIG. 5A is expressed by equation F=−0.3(|x−y|)+log 2 and the correction term shows a degree of degradation of about 0.1 dB.

On the other hand, the threshold value approximation method is designed to approximate function F=log {1+e Ô(−|x−y|)} as indicated by curve C in FIG. 5B by a step function as indicated by curve T. The curve T in FIG. 5B is expressed by a function that gives log 2 for the interval of 0≦|x−y|<1 and 0 for the interval of |x−y|≧1. The correction term shows a degree of degradation of about 0.2 dB.

Thus, while various methods have been discussed for the purpose of log-sum correction, all of them still have something to be improved.

Not only the log-sum correction but also the above described operation of determining the maximum value gives rise to the problem of delay when determining the maximum likelihood path to baffle the efforts for realizing high speed decoding.

BRIEF SUMMARY OF THE INVENTION

In view of the above identified circumstances, it is therefore the object of the present invention to provide a decoder and a decoding method that can realize a high speed decoding operation without sacrificing the performance of the decoder.

In an aspect of the invention, the above object is achieved by providing a decoder adapted to determining a log likelihood logarithmically expressing the probability of passing a state on the basis of the value received as soft-output encoded so as to provide at least three or more paths for getting to each state and decoding by using the log likelihood, said decoder comprising a path selection means for obtaining at least two or more paths showing a high likelihood out of the at least three or more paths for getting to each state and selecting the maximum likelihood path from the obtained at least two or more paths.

Thus, a decoder according to the invention obtains at least two or more paths showing a high likelihood and selects the maximum likelihood path.

In another aspect of the invention, there is provided a decoding method adapted to determining a log likelihood logarithmically expressing the probability of passing a state on the basis of the value received as a soft-output encoded so as to provide at least three or more paths for getting to each state and decoding by using the log likelihood, said decoding method comprising a path selection step of obtaining at least two or more paths showing a high likelihood out of the at least three or more paths for getting to each state and selecting the maximum likelihood path from the obtained at least two or more paths.

Thus, a decoding method according to the invention obtains at least two or more paths showing a high likelihood and selects the maximum likelihood path.

As described above, a decoder according to the invention is adapted to determine a log likelihood logarithmically expressing the probability of passing a state on the basis of the value received as a soft-input encoded so as to provide at least three or more paths for getting to each state and decoding by using the log likelihood, said decoder comprising a path selection means for obtaining at least two or more paths showing a high likelihood out of the at least three or more paths for getting to each state and selecting the maximum likelihood path from the obtained at least two or more paths.

Therefore, a decoder according to the invention obtains at least two or more paths showing a high likelihood by the path selection means and selects the maximum likelihood path so that it operates at high speed without sacrificing the performance.

A decoding method according to the invention is adapted to determine a log likelihood logarithmically expressing the probability of passing a state on the basis of the value received as a soft-input encoded so as to provide at least three or more paths for getting to each state and decoding by using the log likelihood, said decoding method comprising a path selection step of obtaining at least two or more paths showing a high likelihood out of the at least three or more paths for getting to each state and selecting the maximum likelihood path from the obtained at least two or more paths.

Therefore, a decoding method according to the invention obtains at least two or more paths showing a high likelihood and selects the maximum likelihood path in the path selection step so that it provides a high speed operation without sacrificing the performance.

DETAILED DESCRIPTION OF THE INVENTION

Now, the present invention will be described by referring to the views of the accompanying drawings that illustrate preferred embodiments of the invention.

Figure 1:
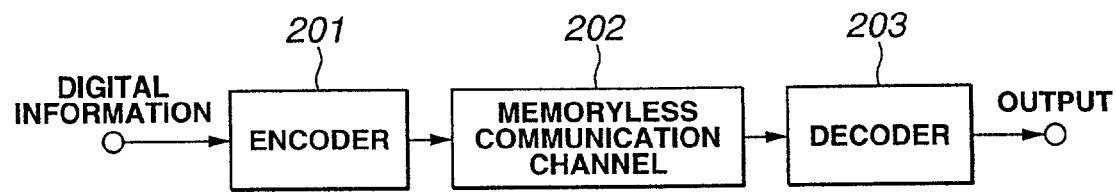
FIG. 1 is a schematic block diagram of a communication model.
Figure 2:
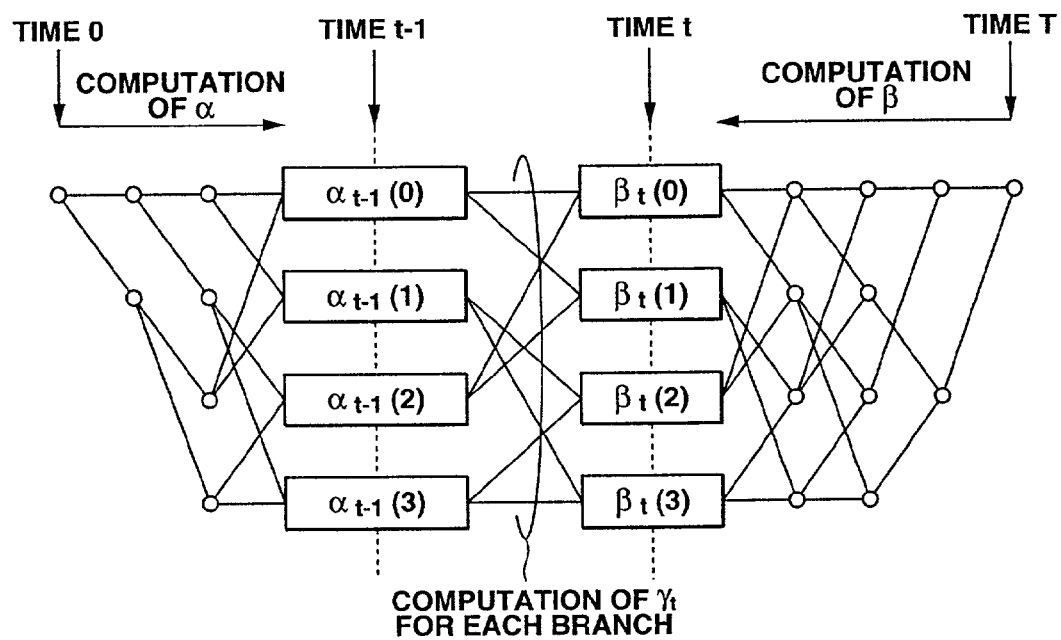
FIG. 2 is a schematic trellis diagram of a conventional encoder, illustrating the contents of probabilities $\alpha_t$, $\beta_t$ and $\gamma_t$.
Figure 3:
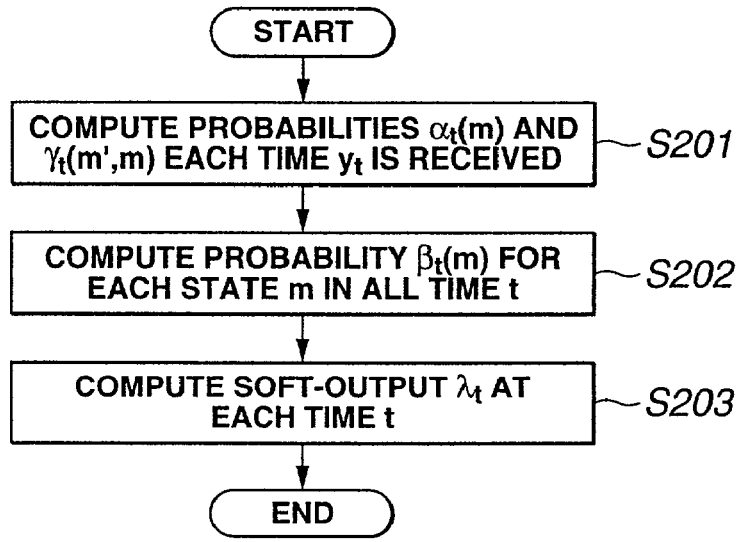
FIG. 3 is a flow chart illustrating the processing steps of a conventional decoder for decoding a soft-output by applying the BCJR algorithm.
Figure 4:
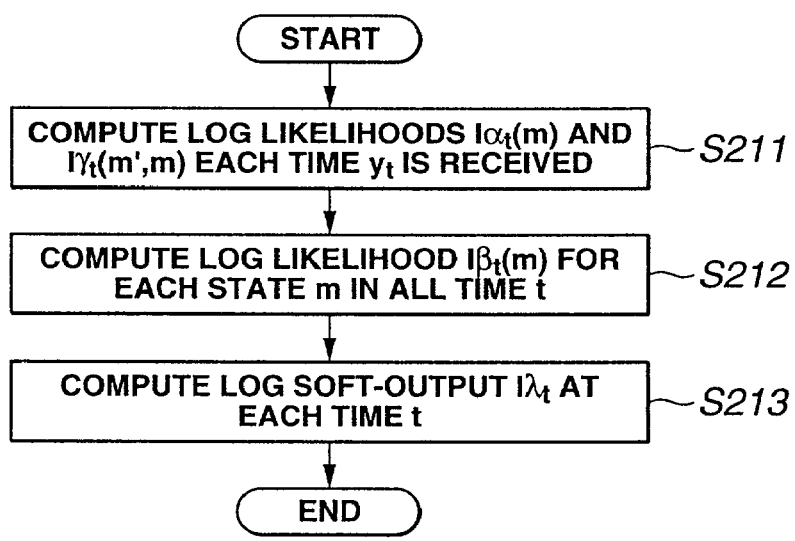
FIG. 4 is a flow chart illustrating the processing steps of a conventional decoder for decoding a soft-output by applying the Max-Log-BCJR algorithm.
Figure 5A:
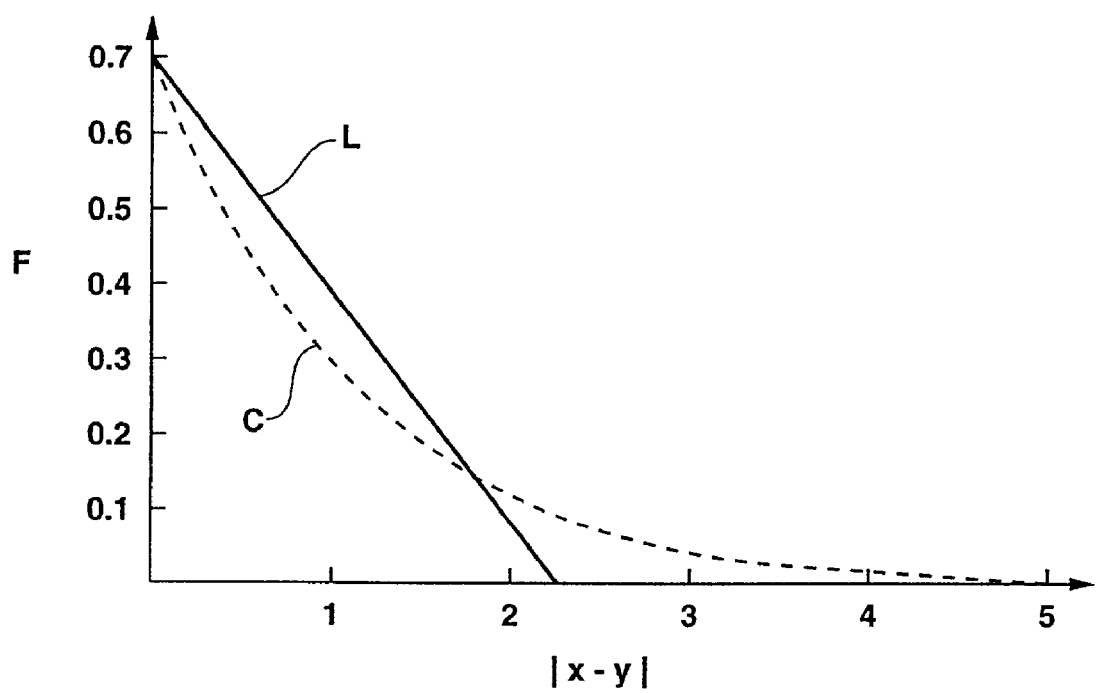
FIG. 5A is a graph illustrating a function having a correction term and an approximating function using a linear approximation technique.
Figure 5B:
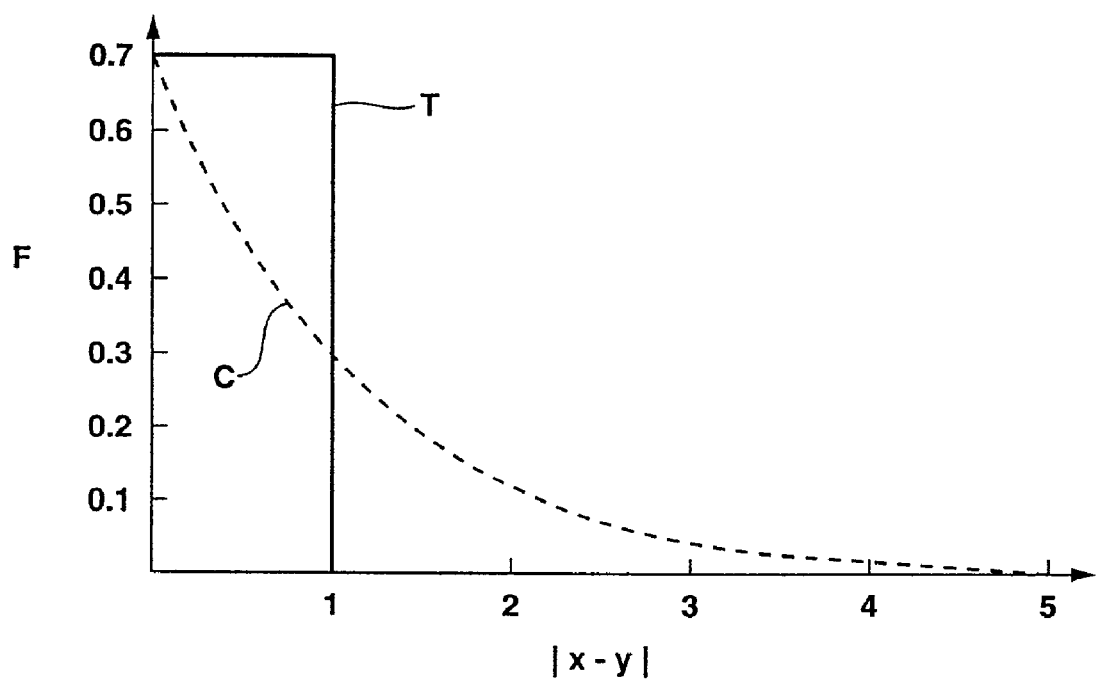
FIG. 5B is a graph illustrating a function having a correction term and an approximating function using a threshold value approximation technique.
Figure 6:
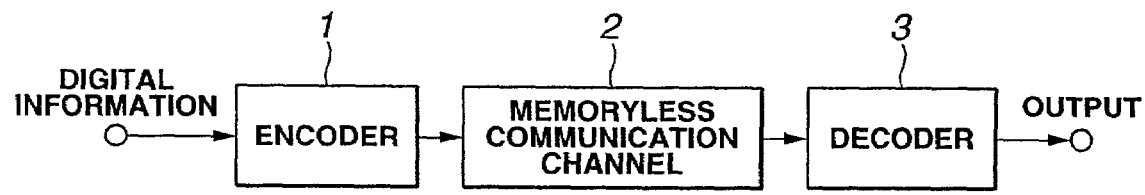
FIG. 6 is a schematic block diagram of a communication model to which a data transmission/reception system comprising an embodiment of the invention is applied.

FIG. 6 is a schematic block diagram of a communication model to which a data transmission/reception system comprising an embodiment of the invention is applied. More specifically, the data transmission/reception system includes a transmission unit (not shown) comprising an encoder 1 for putting digital information into convolutional codes, a memoryless communication channel 2 having noises and adapted to transmitting the output of the transmission unit and a reception unit (not shown) comprising a decoder 3 for decoding the convolutional codes from the encoder 1.

In the data transmission/reception system, the decoder 3 is adapted to decode the convolutional codes output from the encoder 1 on the basis of the maximum a posteriori probability (to be referred to as MAP hereinafter) obtained by using the Max-Log-MAP algorithm or the Log-MAP algorithm (to be respectively referred to as the Max-Log-BCJR algorithm or the Log-BCJR algorithm hereinafter) as described in Robertson, Villebrun and Hoeher, "A Comparison of Optimal and Sub-Optimal MAP decoding algorithms operating in the domain", IEEE Int. Conf. on Communications, pp. 1009–1013, June 1995. More specifically, it is adapted to determine the log likelihoods of $I\alpha_t$, $I\beta_t$ and $I\gamma_t$ and the log soft-output $I\lambda_t$ that are logarithmic expressions of probabilities $\alpha_t$, $\beta_t$ and $\gamma_t$ and soft output $\lambda_t$, using the natural logarithm.

In the following description, the decoder 3 determines log soft-output $I\lambda_t$ by means of MAP decoding conducted on the basis of the Log-BCJR algorithm and log-sum correction using so-called linear approximation. Additionally, the M states (transitional states) representing the contents of the shift registers of the encoder 1 are denoted by integer m (m=0, 1, . . . , M−1) and the state at time t is denoted by $S_t$. If information of k bits is input in a time slot, the input at time t is expressed by $i_t=(i_{t1}, i_{t2}, \ldots, i_{tk})$ and the input system is expressed by $I_1^T=(i_1, i_2, \ldots, i_T)$. If there is a transition from state m' to state m, the information bits corresponding to the transition are expressed by $i(m', m)=(i_1(m', m), i_2(m', m), \ldots, i_k(m', m))$. Additionally, if a code of n bits is output in a time slot, the output at time t is expressed by $x_t=(x_{t1}, x_{t2}, \ldots, x_{tk})$ and the output system is expressed by $X_1^T=(x_1, x_2, \ldots, x_T)$. If there is a transition from state m' to state m, the information bits corresponding to the transition are expressed by $x(m', m)=(x_1(m', m), x_2(m', m), \ldots, x_n(m', m))$. The memoryless communication channel 2 receives $X_1^T$ as input and outputs $Y_1^T$. If a received value of n bits is output in a time slot, the output at time t is expressed by $y_t=(y_{t1}, y_{t2}, \ldots, y_{tn})$ and the output system is expressed by $Y_1^T=(y_1, y_2, \ldots, y_T)$.

Figure 7:
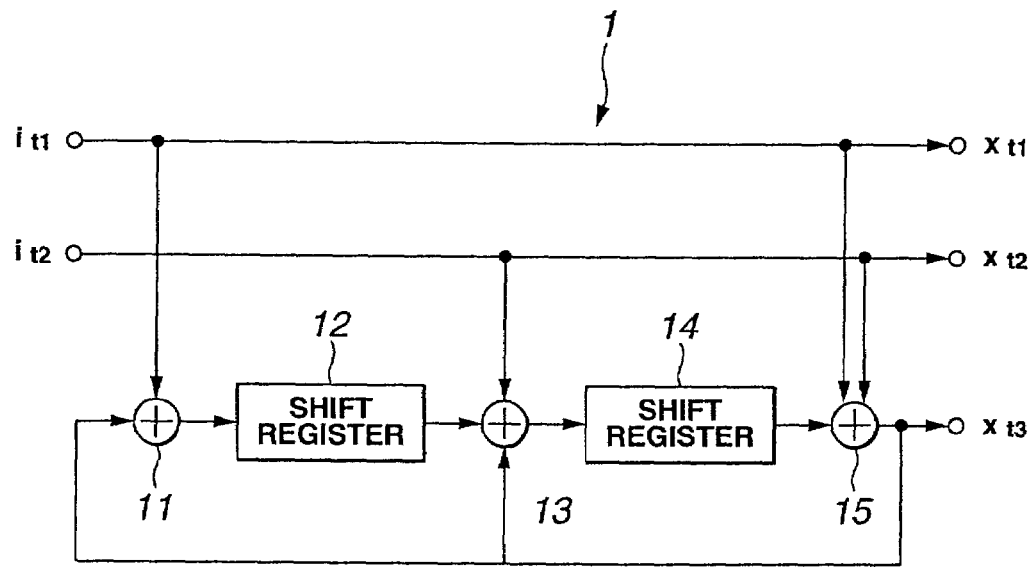
FIG. 7 is a schematic block diagram of the encoder of the data transmission/reception system of FIG. 6.

As shown in FIG. 7, the encoder 1 typically comprises three exclusive OR circuits 11, 13, 15 and a pair of shift registers 12, 14 and is adapted to carry out convolutional operations with a constraint length of "4".

The exclusive OR circuit 11 is adapted to carry out an exclusive OR operation, using 1-bit input data $i_{t1}$ out of 2-bit input data $i_t$ and the data fed from the exclusive OR circuit 15, and supply the shift register 12 with the outcome of the operation.

The shift register 12 keeps on feeding the 1-bit data it holds to the exclusive OR circuit 13. Then, the shift register 12 holds the 1-bit data fed from the exclusive OR circuit 11 in synchronism with a clock and additionally feeds the 1-bit data to the exclusive OR circuit 13.

The exclusive OR circuit 13 is adapted to carry out an exclusive OR operation, using 1-bit input data $i_{t2}$ out of 2-bit input data $i_t$, the data fed from the shift register 12 and the data fed from the exclusive OR circuit 15, and supply the shift register 14 with the outcome of the operation.

The shift register 14 keeps on feeding the 1-bit data it holds to the exclusive OR circuit 15. Then, the shift register 14 holds the 1-bit data fed from the exclusive OR circuit 13 in synchronism with a clock and additionally feeds the 1-bit data to the exclusive OR circuit 15.

The exclusive OR circuit 15 is adapted to carry out an exclusive OR operation, using 2-bit input data $i_{t1}$, $i_{t2}$ and the data fed from the shift register 14, and outputs the outcome of the operation as 1-bit output data $x_{t3}$ of 3-bit output data $x_t$ externally and also to the exclusive OR circuits 11, 13.

Thus, as the encoder 1 having the above described configuration receives 2-bit input data $i_{t1}$, $i_{t2}$, it outputs them as 2-bit input data $x_1$, $x_2$ that are systematic components of 3-bit output data $x_t$ and carries out a recursive convolutional operation on the input data $i_{t1}$, $i_{t2}$. Then, it outputs externally the outcome of the operation as 1-bit output data $x_{t3}$ of 3-bit output data $x_t$. In short, the encoder 1 performs a recursive systematic convolutional operation with a coding ratio of "⅔" and outputs externally output data $x_t$.

Figure 8:
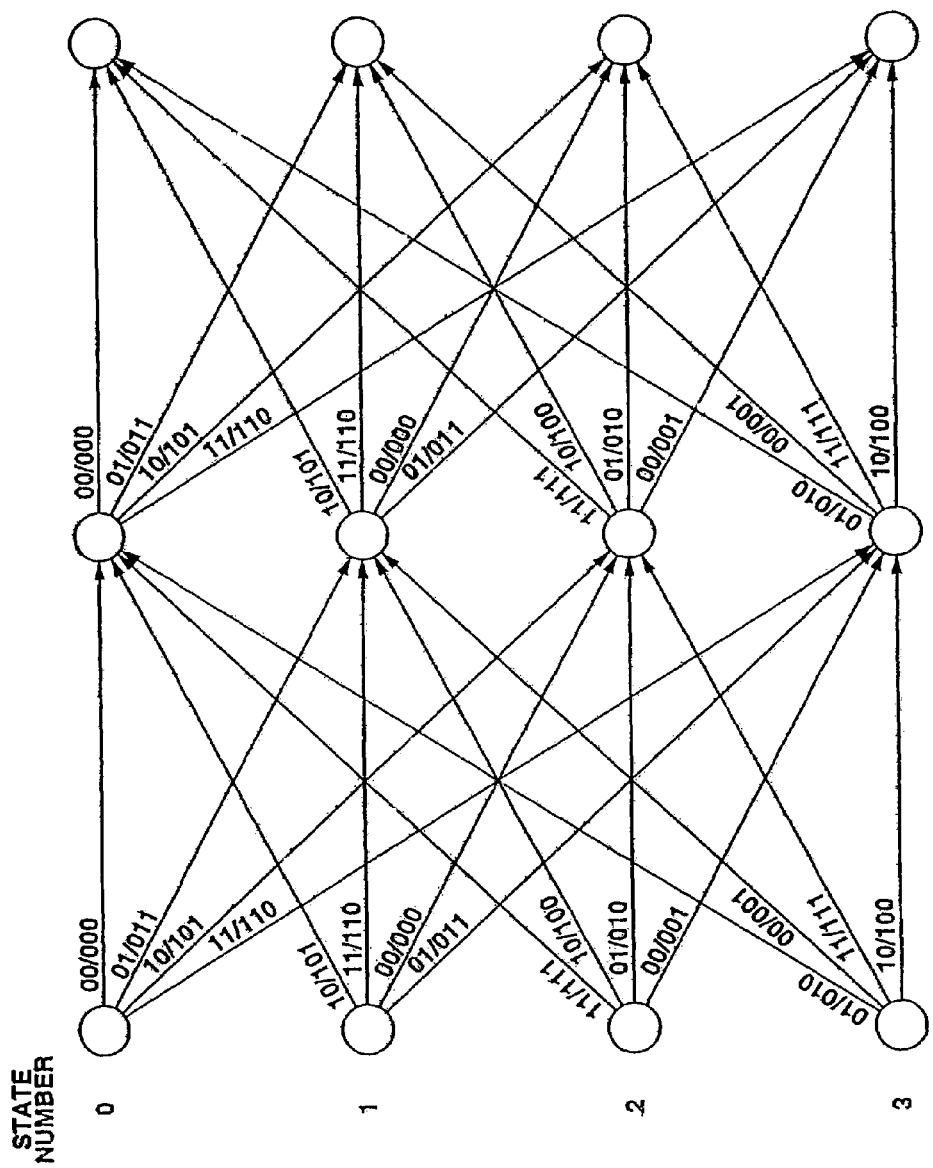
FIG. 8 is a schematic illustration of the trellis of the encoder of FIG. 6.

FIG. 8 illustrates the trellis of the encoder 1. Referring to FIG. 8, the label applied to each path indicates 2-bit input data $i_{t1}$, $i_{t2}$ and 3-bit output data $x_{t1}$, $x_{t2}$, $x_{t3}$. The states here are such that the contents of the shift register 12 and those of the shift register 14 are sequentially arranged and the states "00", "10", "01", "11" are denoted respectively by state numbers "0", "1", "2", "3". Thus, the number of states M of the encoder 1 is four and the trellis has such a structure that there are four paths getting to the states in the next time slot from the respective states. In the following description, the states corresponding to the above state numbers are denoted respectively by state 0, state 1, state 2, state 3.

The coded output data $x_t$ of the encoder 1 are then output to the receiver by way of the memoryless communication channel 2.

Figure 9:
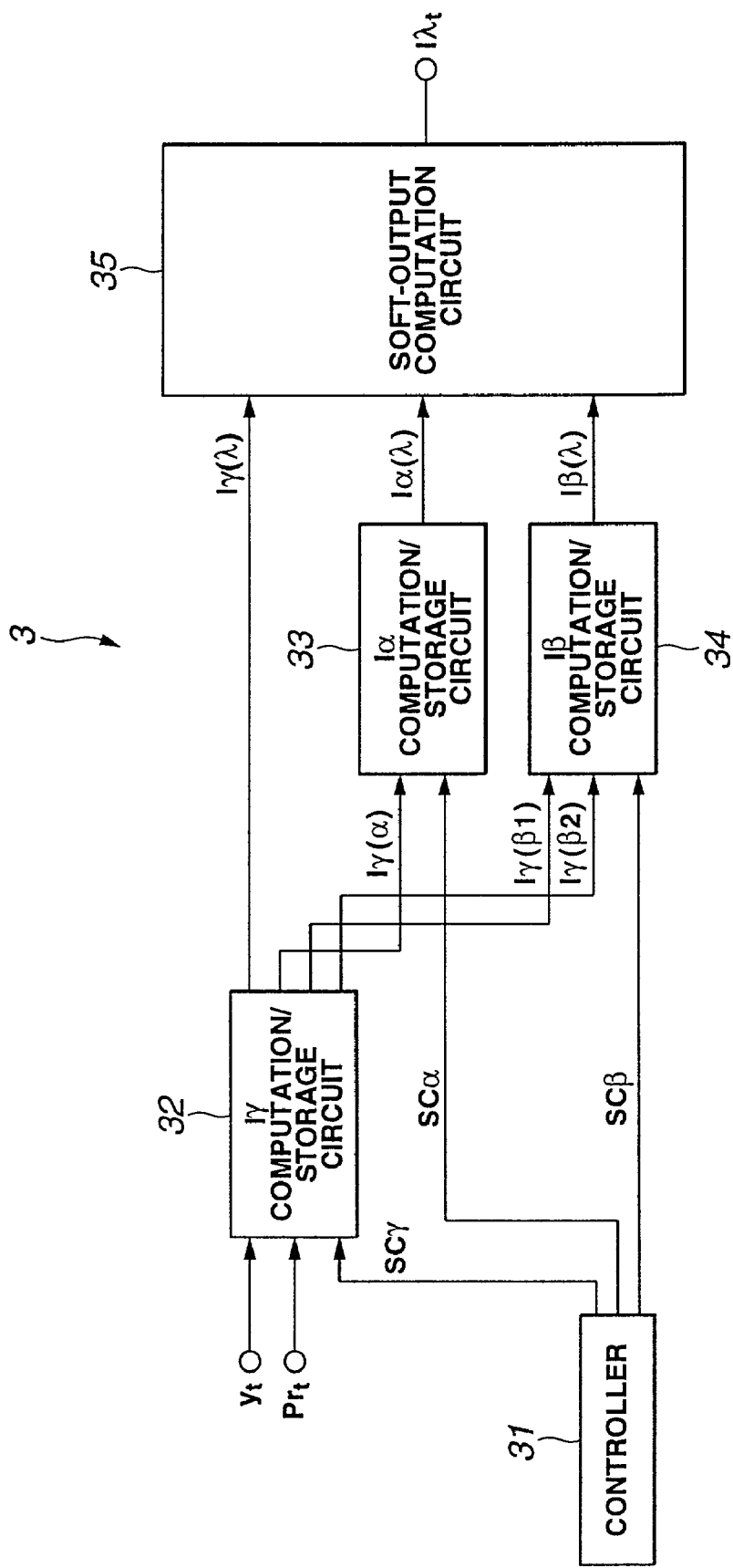
FIG. 9 is a schematic block diagram of the decoder of the data transmission/reception system of FIG. 6.

On the other hand, as shown in FIG. 9, the decoder 3 comprises a controller 31 for controlling the various components of the decoder 3, an Iγ computation/storage circuit 32 operating as the first probability computing means for computing and storing log likelihood Iγ as the first log likelihood, an Iα computation/storage circuit 33 operating as the second probability computing means for computing and storing log likelihood Iα as the second log likelihood, an Iβ computation/storage circuit 34 operating as the third probability computing means for computing and storing log likelihood Iβ as the third log likelihood and a soft-output computation circuit 35 operating as soft-output computing means for computing log soft-output $I\lambda_t$. The decoder 3 estimates the input data $i_t$ of the encoder 1 by determining the log soft-output $I\lambda_{2t}$ from the received value $y_t$ showing an analog value under the influence of the noises generated on the memoryless communication channel 2 and hence regarded as soft-output.

The controller 31 supplies control signals SCγ, SCα and SCβ respectively to the Iγ computation/storage circuit 32, the Iα computation/storage circuit 33 and the Iβ computation/storage circuit 34 to control these circuits.

The Iγ computation/storage circuit 32 carries out the operation of formula (25) below for each received value $y_t$ under the control of the control signal SCγ fed from the controller 31, using the received value $y_t$ and a priori probability information $Pr_t$, to compute the log likelihood $I\gamma_t$ at time t and stores the obtained log likelihood. In short, the Iγ computation/storage circuit 32 computes the log likelihood Iγ expressing the probability γ in the log domain as determined for each received value $y_t$ on the basis of the code output pattern and the received value.

$$I\gamma_t(m',m) = \log(Pr\{i_t = i(m',m)\}) + \log(Pr\{y_t|x(m',m)\}) \quad (25)$$

The a priori probability $Pr_t$ is obtained as probability Pr $\{i_t=1\}$ that each of input data $i_{t1}$, $i_{t2}$ is equal to "1" or probability Pr $\{i_t=0\}$ that each of input data $i_{t1}$, $i_{t2}$ is equal to "0" as indicated by formula (26) below. The a priori probability $Pr_t$ can alternatively be obtained as probability Pr $\{i_t=1\}$ or probability Pr $\{i_t=0\}$ by inputting the natural log value of the log likelihood ratio of probability Pr $\{i_t=1\}$ to Pr $\{i_t=0\}$, considering the fact that the sum of the probability Pr $\{i_t=1\}$ and the probability Pr $\{i_t=0\}$ is equal to "1".

$$Pr_t = \begin{cases} \log Pr\{i_t = 1\} \\ \log Pr\{i_t = 0\} \end{cases} \quad (26)$$

The Iγ computation/storage circuit 32 supplies the log likelihood $I\gamma_t$ it stores to the Iα computation/storage circuit 33, the Iβ computation/storage circuit 34 and the soft-output computation circuit 35. More specifically, the Iγ computation/storage circuit 32 supplies the log likelihood $I\gamma_t$ to the Iα computation/storage circuit 33, the Iβ computation/storage circuit 34 and the soft-output computation circuit 35 in a sequence good for the processing operations of these circuits. In the following description, the log likelihood $I\gamma_t$ supplied from the Iγ computation/storage circuit 32 to the Iα computation/storage circuit 33 is expressed by Iγ (α), the log likelihood $I\gamma_t$ supplied from the Iγ computation/storage circuit 32 to the Iβ computation/storage circuit 34 is expressed by Iγ (β) and the log likelihood $I\gamma_t$ supplied from the Iγ computation/storage circuit 32 to soft-output computation circuit 35 is expressed by Iγ (λ).

The Iα computation/storage circuit 33 carries out the operation of formula (27) below under the control of the control signal SCα fed from the controller 31, using the log likelihood Iγ (α) fed from the Iγ computation/storage circuit 32 to compute the log likelihood $I\alpha_t$ at time t and stores the obtained log likelihood. In the formula (27), operator "#" denotes the so-called log-sum operation for the log likelihood of transition from state m' to state m with input "0" and the log likelihood of transition from state m'' to state m with input "1". More specifically, the Iα computation/storage circuit 33 computes the log likelihood $I\alpha_t$ at time t by carrying out the operation of formula (28). In other words, the Iα computation/storage 33 computes the log likelihood Iα expressing in the log domain the probability α of transition from the coding starting state to each state as determined on a time series basis for each received value $y_t$. Then, the Iα computation/storage circuit 33 supplies the log likelihood $I\alpha_t$ it stores to the soft-output computation circuit 35. At this time the Iα computation/storage circuit 33 supplies the log likelihood $I\alpha_t$ to the soft-output computation circuit 35 in a sequence good for the processing operations of the circuit 35. In the following description, the log likelihood $I\alpha_t$ supplied from the Iα computation/storage circuit 33 to the soft-output computation circuit 35 is expressed by Iα(λ).

$$I\alpha_t(m) = (I\alpha_{t-1}(m') + I\gamma_t(m',m)) \# (I\alpha_{t-1}(m'') + I\gamma_t((m'',m)) \quad (27)$$

$$I\alpha_t(m) = \max(I\alpha_{t-1}(m') + I\gamma_t(m',m), I\alpha_{t-1}(m'') + I\gamma_t(m'',m)) + \log(1 + e^{-|(I\alpha_{t-1}(m') + I\gamma_t(m',m)) \ldots (I\alpha_{t-1}((m'') + I\gamma_t(m'',m))|}) \quad (28)$$

The Iβ computation/storage circuit 34 carries out the operation of formula (29) below under the control of the control signal SCβ fed from the controller 31, using the log likelihoods Iγ (β1) and Iγ (β2) fed from the Iγ computation/storage circuit 32 to compute the log likelihoods $I\beta_t$ at time t of the two systems and stores the obtained log likelihoods. In the formula (29), operator "#" denotes the so-called log sun operation for the log likelihood of transition from state m' to state m with input "0" and the log likelihood of transition from state m'' to state m with input "1". More specifically, the Iβ computation/storage circuit 34 computes the log likelihood $I\beta_t$ at time t by carrying out the operation of formula (30). In other words, the Iβ computation/storage 34 computes the log likelihood Iβ expressing in the log domain the probability β of inverse transition from the coding terminating state to each state as determined on a time series basis for each received value $y_t$. Then, the Iβ computation/storage circuit 34 supplies the log likelihood $I\beta_t$ of one of the systems out of the log likelihoods $I\beta_t$ it stores to the soft-output computation circuit 35. At this time the Iβ computation/storage circuit 34 supplies the log likelihood $I\beta_t$ to the soft-output computation circuit 35 in a sequence good for the processing operations of the circuit 35. In the following description, the log likelihood $I\beta_t$ supplied from the Iβ computation/storage circuit 34 to the soft-output computation circuit 35 is expressed by Iβ(λ).

$$I\beta_t(m) = (I\beta_{t+1}(m') + I\gamma_{t+1}(m,m')) \# (I\beta_{t+1}(m'') + I\gamma_{t+1}(m,m'')) \quad (29)$$

$$I\beta_t(m) = \max(I\beta_{t+1}(m') + I\gamma_{t+1}(m,m'), I\beta_{t+1}(m'') + I\gamma_{t+1}(m,m'')) + \log(1 + e^{-|(I\beta_{t+1}(m') + I\gamma_{t+1}(m,m')) - (I\beta_{t+1}(m'') + I\gamma_{t+1}(m,m''))|}) \quad (30)$$

The soft-output computation circuit 35 carries out the operation of formula (31) below, using the log likelihood Iγ

(λ) fed from the Iγ computation/storage circuit 32 and the log likelihood Iα (λ) fed from the Iα computation/storage circuit 33, and the log likelihood Iβ (λ) fed from the Iβ computation/storage circuit 34 to compute the log soft-output Iλ$_t$ at time t and stores the obtained log soft-outputs. After rearranging the log soft-outputs Iλ$_t$ it sores, the soft-output computation circuit 35 outputs them externally. In the formula (31), operator "#Σ" denotes the cumulative addition of the so-called log sum operations using the above described operator "#".

$$I\lambda_t = \# \sum_{\substack{m',m \\ i(m',m)=1}} (I\alpha_{t-1}(m') + I\gamma_t(m',m) + I\beta_t(m)) - \quad (31)$$

$$\# \sum_{\substack{m',m \\ i(m',m)=0}} (I\alpha_{t-1}(m') + I\gamma_t(m',m) + I\beta_t(m))$$

The decoder 3 having the above described configuration computes the log likelihood γ$_t$ (m', m) for each received value y$_t$ by means of the Iγ computation/storage circuit 32 and also the log likelihood Iα$_t$ (m) by means of the Iα computation/storage circuit 33 each time it receives as input the soft-input value y$_t$ received by the receiving unit. Upon receiving all the received values y$_t$, the decoder 3 computes the log likelihood Iβ$_t$ (m) for each state m for all the values of time t by means of the Iβ computation/storage circuit 34. Then, the decoder 3 computes the log soft-output Iλ$_t$ for each time t by means of the soft-output computation circuit 35, using the obtained log likelihoods Iα$_t$, Iβ$_t$ and Iγ$_t$. In this way, the decoder 3 can operate for soft-output decoding by applying the Log-BCJR algorithm.

Now, the decoder 3 operates at high speed with a reduced circuit size when computing the log likelihoods Iα$_t$ and Iβ$_t$ by means of the Iα computation/storage circuit 33 and the Iβ computation/storage circuit 34. The Iα computation/storage circuit 33 and the Iβ computation/storage circuit 34 will be described in greater detail hereinafter.

Figure 10:
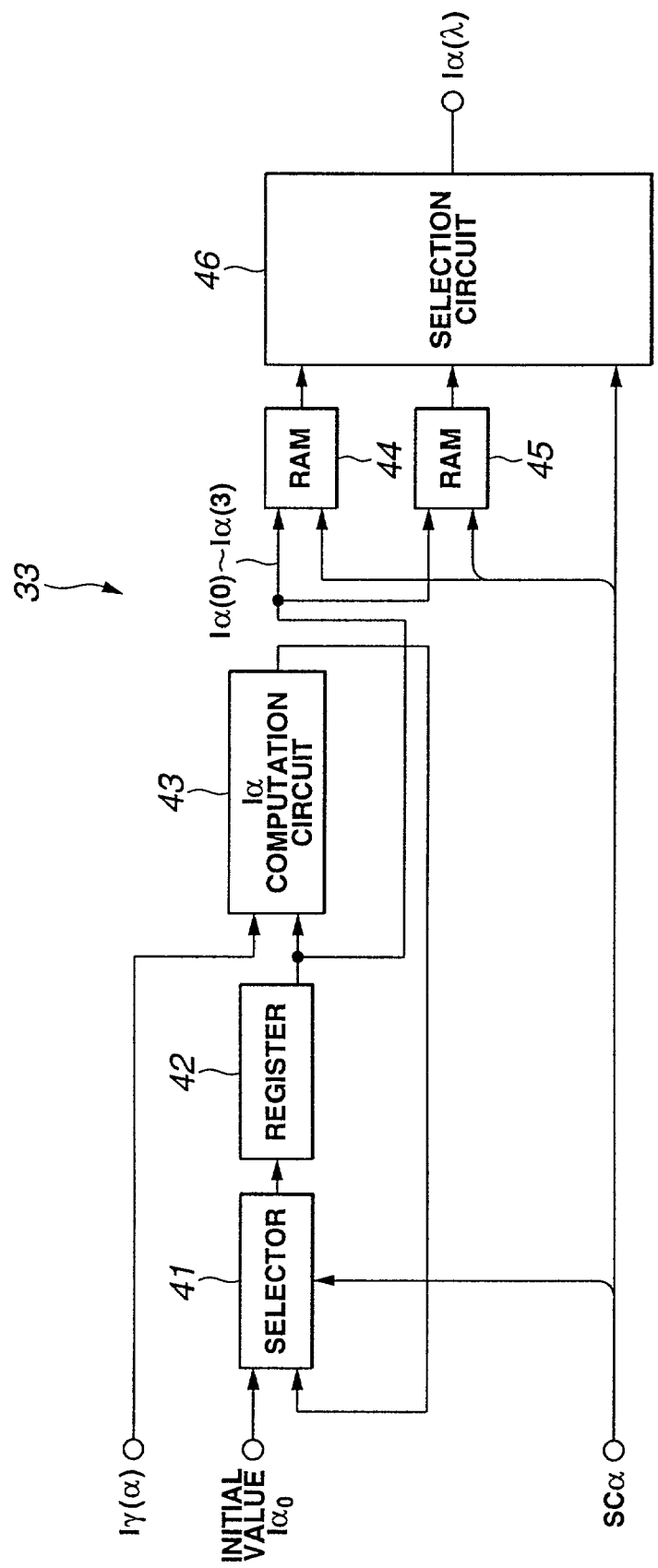
FIG. 10 is a schematic block diagram of the Iα computation/storage circuit of the decoder of FIG. 9, illustrating the circuit configuration.

Firstly, the Iα computation/storage circuit 33 will be described. As shown in FIG. 10, the Iα computation/storage circuit 33 comprises a selector 41 for selecting either the computed log likelihoods Iα or the initial value of the log likelihood Iα$_0$, a register 42 for holding either the computed log likelihoods Iα or the initial value of the log likelihood Iα$_0$, an Iα computation circuit 43 for computing the log likelihood Iα in each state, RAMs (Random Access Memories) 44, 45 for sequentially holding the log likelihoods Iα of different states and a selection circuit 46 for selectively taking out the log likelihood Iα read out from the RAMs 44, 45.

The selector 41 selects the initial value of the log likelihood Iα$_0$ at the time of initialization or the log likelihoods Iα fed from the Iα computation circuit 43 at any time except the time of initialization under the control of control signal SCα fed from the controller 31. The initialization occurs in the time slot immediately before the Iγ computation/storage circuit 32 starts outputting log likelihoods Iγ (α). If the decoder 3 realizes the time when the encoder 1 starts a coding operation, log 1=0 is given as initial value Iα$_0$ in state 0 whereas log 0=−∞ is given as initial value in any other state. If, on the other hand, the decoder 3 does not realize the time when the encoder 1 starts a coding operation, log (1/M), or log (¼) in the above instance, is given in all states. However, what is essential here is that a same value is given in all states so that 0 may alternatively be given in all states.

The selector 41 supplies the initial value Iα$_0$ or the log likelihoods Iα, whichever it selects, to the register 42.

The register 42 holds the initial value Iα$_0$ or the log likelihoods Iα supplied from the selector 41. Then, in the next time slot, the register 42 supplies the initial value Iα$_0$ or the log likelihoods Iα it holds to the Iα computation circuit 43 and the RAMs 44, 45.

Figure 11:
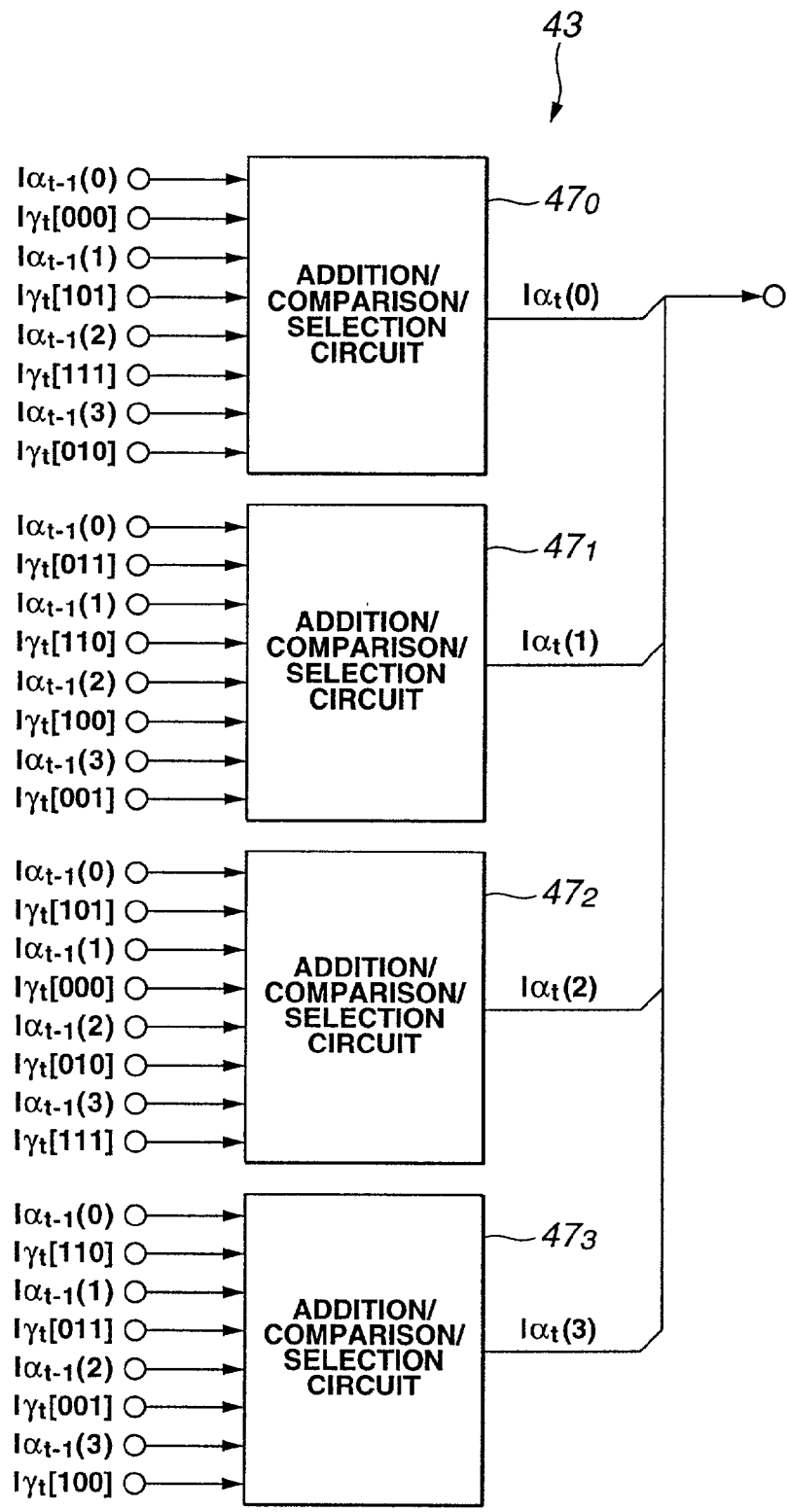
FIG. 11 is a schematic block diagram of the Iα computation circuit of the Iα computation/storage circuit of FIG. 10, illustrating the circuit configuration.

Referring now to FIG. 11, the Iα computation circuit 43 comprises addition/comparison/selection circuits, the number of which corresponds to the number of states. In the above instance, the Iα computation circuit 43 comprises four addition/comparison/selection circuits 47$_0$, 47$_1$, 47$_2$ and 47$_3$.

Each of the addition/comparison/selection circuits 47$_0$, 47$_1$, 47$_2$ and 47$_3$ are fed with the log likelihoods Iγ$_t$ [000], Iγ$_t$ [001], Iγ$_t$ [010], Iγ$_t$ [011], Iγ$_t$ [100], Iγ$_t$ [101], Iγ$_t$ [110] and Iγ$_t$ [111] of the branches corresponding to the respective outputs "000", "001", "010", "011", "100", "101", "110" and "111" on the trellis as computed by the Iγ computation/storage circuit 32 on the basis of the transitions on the trellis and the log likelihoods in all the sates in the immediately preceding time slot Iα$_{t-1}$ (0), Iα$_{t-1}$ (1), Iα$_{t-1}$ (2), Iα$_{t-1}$ (3). Then, each of the addition/comparison/selection circuits 47$_0$, 47$_1$, 47$_2$ and 47$_3$ determines the log likelihoods Iα in the next time slot in state 0, state 1, state 2 and state 3.

More specifically, the addition/comparison/selection circuits 47$_0$ receives the log likelihoods Iγ$_t$ [000], Iγ$_t$ [101], Iγ$_t$ [111], Iγ$_t$ [010] and the log likelihoods Iα$_{t-1}$ (0), Iα$_{t-1}$ (1), Iα$_{t-1}$ (2), Iα$_{t-1}$ (3) as inputs and determines the log likelihood Iα$_t$ (0) in state 0.

Similarly, the addition/comparison/selection circuits 47$_1$ receives the log likelihoods Iγ$_t$ [011], Iγ$_t$ [110], Iγ$_t$ [100], Iγ$_t$ [001] and the log likelihoods Iα$_{t-1}$ (0), Iα$_{t-1}$ (1), Iα$_{t-1}$ (2), Iα$_{t-1}$ (3) as inputs and determines the log likelihood Iα$_t$ (1) in state 1.

Then, the addition/comparison/selection circuits 47$_2$ receives the log likelihoods Iγ$_t$ [101], Iγ$_t$ [000], Iγ$_t$ [010], Iγ$_t$ [111] and the log likelihoods Iα$_{t-1}$ (0), Iα$_{t-1}$ (1), Iα$_{t-1}$ (2), Iα$_{t-1}$ (3) as inputs and determines the log likelihood Iα$_t$ (2) in state 2.

Furthermore, the addition/comparison/selection circuits 47$_3$ receives the log likelihoods Iγ$_t$ [110], Iγ$_t$ [011], Iγ$_t$ [001], Iγ$_t$ [100] and the log likelihoods Iα$_{t-1}$ (0), Iα$_{t-1}$ (1), Iα$_{t-1}$ (2), Iα$_t$ (3) as inputs and determines the log likelihood Iα$_t$ (3) in state 3.

In this way, the Iα computation circuit 43 performs the computation of the formula (27) and hence that of the formula (28) above, using the log likelihoods Iγ (α) fed from the Iγ computation/storage circuit 32 and the initial value Iα$_0$ or the log likelihoods Iα in the immediately preceding time slot held by the register 42, to determine the log likelihoods Iα in all states in the next time slot. Then, the Iα computation circuit 43 supplies the computed log likelihoods Iα to the selector 41. The addition/comparison/selection circuits 47$_0$, 47$_1$, 47$_2$ and 47$_3$ will be described in greater detail hereinafter.

The RAMs 44, 45 sequentially stores the log likelihoods Iα (0), Iα (1), Iα (2) and Iα (3) fed from the register 42 under the control of the control signal SCα from the controller 31. If each of the log likelihoods Iα (0), Iα (1), Iα (2) and Iα (3) is expressed in 8 bits, the RAMs 44, 45 stores the log likelihoods Iα (0), Iα (1), Iα (2) and Iα (3) as a word of 32 bits. The log likelihoods Iα (0), Iα (1), Iα (2) and Iα (3) stored in the RAMs 44, 45 are then read out therefrom by selection circuit 46 in a predetermined sequence.

The selection circuit 46 selectively takes out the log likelihoods Iα (0), Iα (1), Iα (2) or Iα (3) that are read from the RAMs 44, 45 and supplies it to the soft-output computation circuit 35 as log likelihood Iα (λ) under the control of the control signal SCα from the controller 31.

Thus, the Iα computation/storage circuit 33 initializes in a time slot immediately before the Iγ computation/storage circuit 32 starts outputting log likelihoods Iγ (α) and causes the register 42 to hold the initial value $I\alpha_0$ selected by the selector 41. Then, in the subsequent clock cycles, the Iα computation/storage circuit 33 causes the Iα computation circuit 43 to sequentially compute the log likelihoods Iα in the next time slot, using the log likelihoods Iγ (α) fed from the Iγ computation/storage circuit 32 and the log likelihoods Iα in the immediately preceding time slot fed from the register 42, and makes the register 42 store the log likelihoods Iα. Furthermore, the Iα computation/storage 33 causes the RAMs 44, 45 to sequentially store the log likelihoods Iα (0), Iα (1), Iα (2) and Iα (3) in the respective states held in the register 42 and makes the selection circuit 46 to read them out in a predetermined sequence and supply them to the soft-output computation circuit 35 as log likelihoods Iα (λ).

Figure 12:
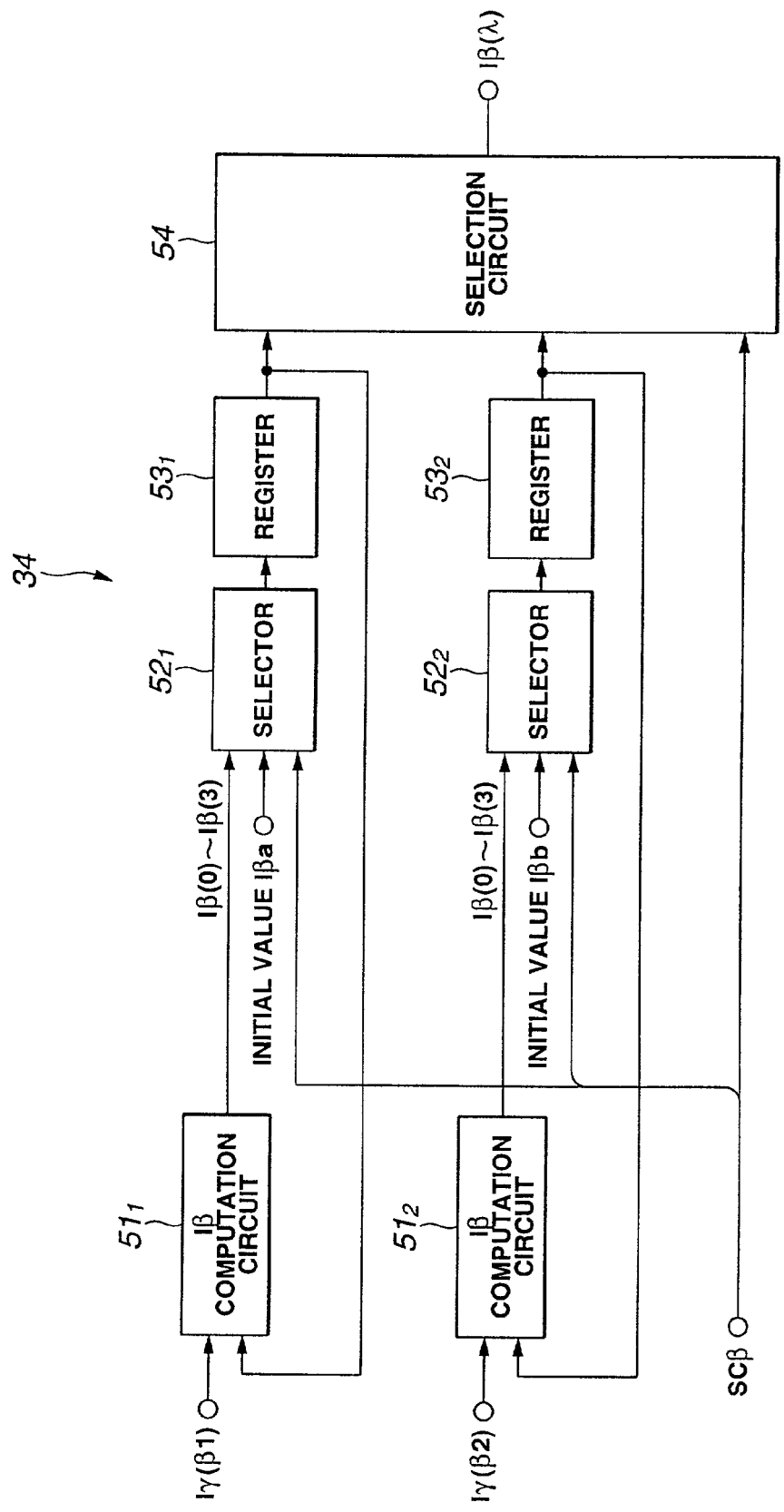
FIG. 12 is a schematic block diagram of the Iβ computation/storage circuit of the decoder of FIG. 9, illustrating the circuit configuration.

Now, the Iβ computation/storage circuit 34 will be described. As shown in FIG. 12, the Iβ computation/storage circuit 34 comprises Iβ computation circuits $51_1$, $51_2$ for computing the log likelihoods Iβ in the states, selectors $52_1$, $52_2$ for selecting either the computed log likelihoods Iβ or the initial values of the log likelihoods Iβa, Iβb, registers $53_1$, $53_2$ for holding the initial values Iβa, Iβb or the log likelihoods Iβ and a selection circuit 54 for selectively taking out one of the log likelihoods fed from the registers $53_1$, $53_2$.

Figure 13:
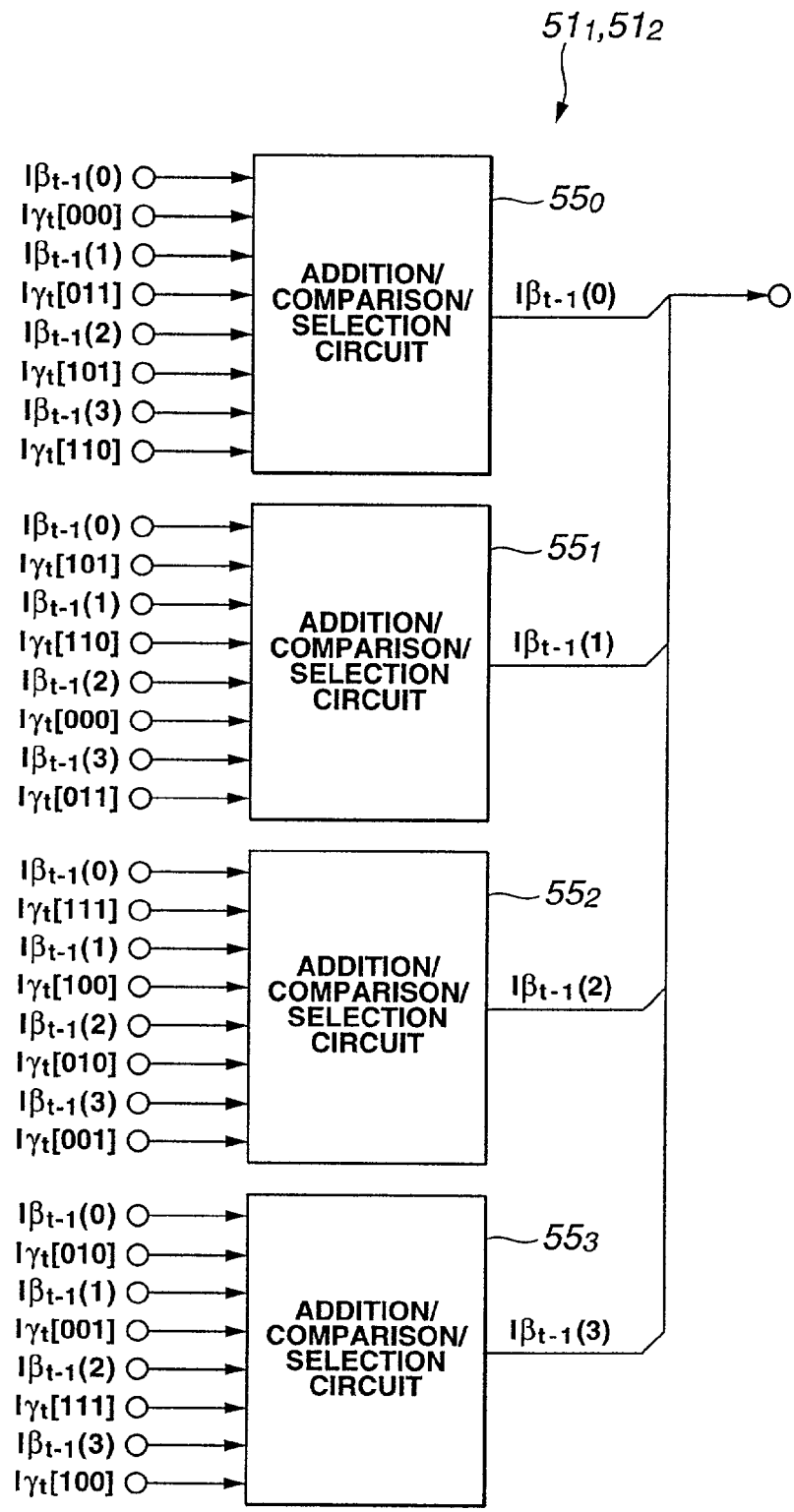
FIG. 13 is a schematic block diagram of the Iβ computation circuit of the Iβ computation/storage circuit of FIG. 12, illustrating the circuit configuration.

Referring now to FIG. 13, each of the Iβ computation circuits $51_1$, $51_2$ comprises addition/comparison/selection circuits, the number of which corresponds to the number of states. In the above instance, each of the Iβ computation circuits $51_1$, $51_2$ comprises four addition/comparison/selection circuits $55_0$, $55_1$, $55_2$ and $55_3$.

Each of the addition/comparison/selection circuits $55_0$, $55_1$, $55_2$ and $55_3$ are fed with the log likelihoods $I\gamma_t$ [000], $I\gamma_t$ [001], $I\gamma_t$ [010], $I\gamma_t$ [011], $I\gamma_t$ [100], $I\gamma_t$ [101], $I\gamma_t$ [110] and $I\gamma_t$ [111] of the branches corresponding to the respective outputs "000", "001", "010", "011", "100", "101", "110" and "111" on the trellis as computed on the basis of the transitions on the trellis by the Iγ computation/storage circuit 32 and the log likelihoods in all the sates in the immediately preceding time slot $I\beta_t$ (0), $I\beta_t$ (1), $I\beta_t$ (2) and $I\beta_t$ (3). Then, each of the addition/comparison/selection circuits $55_0$, $55_1$, $55_2$ and $55_3$ determines the log likelihoods Iβ in the immediately preceding time slot in state 0, state 1, state 2 and state 3.

More specifically, the addition/comparison/selection circuits $55_0$ receives the log likelihoods $I\gamma_t$ [000], $I\gamma_t$ [011], $I\gamma_t$ [101], $I\gamma_t$ [110] and the log likelihoods $I\beta_t$ (0), $I\beta_t$ (1), $I\beta_t$ (2), $I\beta_t$ (3) as inputs and determines the log likelihood $I\beta_{t-1}$ (0) in state 0.

Similarly, the addition/comparison/selection circuits $55_1$ receives the log likelihoods $I\gamma_t$ [101], $I\gamma_t$ [110], $I\gamma_t$ [000], $I\gamma_t$ [011] and the log likelihoods $I\beta_t$ (0), $I\beta_t$ (1), $I\beta_t$ (2), $I\beta_t$ (3) as inputs and determines the log likelihood $I\beta_{t-1}$ (1) in state 1.

Then, the addition/comparison/selection circuits $55_2$ receives the log likelihoods $I\gamma_t$ [111], $I\gamma_t$ [100], $I\gamma_t$ [010], $I\gamma_t$ [001] and the log likelihoods $I\beta_t$ (0), $I\beta_t$ (1), $I\beta_t$ (2), $I\beta_t$ (3) as inputs and determines the log likelihood $I\beta_{t-1}$ (2) in state 2.

Furthermore, the addition/comparison/selection circuits $55_3$ receives the log likelihoods $I\gamma_t$ [010], $I\gamma_t$ [001], $I\gamma_t$ [111], $I\gamma_t$ [100] and the log likelihoods $I\beta_t$ (0), $I\beta_t$ (1), $I\beta_t$ (2), $I\beta_t$ (3) as inputs and determines the log likelihood $I\beta_{t-1}$ (3) in state 3.

In this way, each of the Iβ computation circuits $51_1$, $51_2$ performs the computation of the formula (29) and hence that of the formula (30) above, using the log likelihoods Iγ (β1), Iγ (β2) fed from the Iγ computation/storage circuit 32 and the initial values Iβa, Iβb or the log likelihoods Iβ held by the registers $53_1$, $53_2$, to determine the log likelihoods Iβ in all states in the immediately preceding time slot. Each of the log likelihoods Iβ (0), Iβ (1), Iβ (2), Iβ (3) is expressed typically by 8 bits to make the total number of bits equal to 32. The Iβ computation circuits $51_1$, $51_2$ respectively supply the computed log likelihoods Iβ to the selectors $52_1$, $52_2$. The addition/comparison/selection circuits $55_0$, $55_1$, $55_2$ and $55_3$ will be described in greater detail hereinafter.

Each of the selectors $52_1$, $52_2$ selects the initial value of the log likelihood Iβa or Iβb, whichever appropriate, at the time of initialization or the log likelihoods Iβ fed from the Iβ computation circuit $52_1$ or $52_2$, whichever appropriate, at any time except the time of initialization under the control of control signal SCβ fed from the controller 31. The initialization occurs in the time slot immediately before the Iγ computation/storage circuit 32 starts outputting log likelihoods Iγ (β1), Iγ (β2) and repeated in every cycle thereafter that is twice as long as the terminating length. While a same value such as 0 or log (1/M), or log (¼) in this instance, is normally given as initial values Iβa, Iβb for all the states, log 1=0 is given as the value in the concluding state whereas log 0=−∞ is given in any other state when a concluded code is decoded. The selectors $52_1$, $52_2$ supplies respectively either the initial values Iβa, Iβb or the log likelihoods Iβ they select to the respective registers $53_1$, $53_2$.

The registers $53_1$, $53_2$ hold the initial values Iβa, Iβb or the log likelihoods Iβ supplied from the selectors $52_1$, $52_2$. Then, in the next time slot, the registers $53_1$, $53_2$ supply the initial values Iβa, Iβb or the log likelihoods Iβ they hold to the Iβ computation circuits $51_1$, $51_2$ and the selection circuit 54.

The selection circuit 54 selectively takes out the log likelihoods Iβ (0), Iβ (1), Iβ (2) or Iβ (3) that are supplied from the registers $53_1$, $53_2$ and supplies it to the soft-output computation circuit 35 as log likelihood Iβ (λ) under the control of the control signal SCβ from the controller 31.

Thus, the Iβ computation/storage circuit 34 initializes in a time slot immediately before the Iγ computation/storage circuit 32 starts outputting log likelihoods Iγ (β1) and in the subsequently cycle periods having a length twice as long as the terminating length and causes the register $53_1$ to hold the initial value Iβa selected by the selector $52_1$. Then, in the subsequent clock cycles, the Iβ computation/storage circuit 34 causes the Iβ computation circuit $51_1$ to sequentially compute the log likelihoods Iβ in the immediately preceding time slot, using the log likelihoods Iγ (β1) fed from the Iγ computation/storage circuit 32 and the log likelihoods Iβ fed from the register $52_1$, and makes the register $53_1$ store the log likelihoods Iβ.

Furthermore, the Iβ computation/storage circuit 34 initializes in a time slot immediately before the Iγ computation/storage circuit 32 starts outputting log likelihoods Iγ (β2) and in the subsequently cycle periods having a length twice as long as the terminating length and causes the register $53_2$ to hold the initial value Iβb selected by the selector $52_2$. Then, in the subsequent clock cycles, the Iβ computation/storage circuit 34 causes the Iβ computation circuit $51_2$ to sequentially compute the log likelihoods Iβ in the immediately preceding time slot, using the log likelihoods Iγ (β2) fed from the Iγ computation/storage circuit 32 and the log likelihoods Iβ fed from the register $52_2$, and makes the register $53_2$ store the log likelihoods Iβ. Then, the Iβ computation/storage circuit 34 causes the selection circuit 54 to read out the log likelihoods Iβ (0), Iβ (1), Iβ (2) and Iβ (3) in the respective states held in the registers $53_1$, $53_2$ in a predetermined sequence and supply them to the soft-output computation circuit 35 as log likelihoods Iβ (λ).

Now, the addition/comparison/selection circuits $47_0$, $47_1$, $47_2$ and $47_3$ that the Iα computation/storage circuit 33 comprises and the addition/comparison/selection circuits $55_0$, $55_1$, $55_2$ and $55_3$ that the Iβ computation/storage circuit 34 comprises will be described below. However, since the addition/comparison/selection circuits $47_0$, $47_1$, $47_2$, $47_3$, $55_0$, $55_1$, $55_2$ and $55_3$ have a same and identical configuration and only differ from each other in term of inputs they receive and outputs they send out. Therefore, in the following description, they will be collectively referred to as addition/comparison/selection circuit 60 or addition/comparison/selection circuit 120. Furthermore, in the following description, the four log likelihoods Iγ input respectively to the four addition/comparison/selection circuits $47_0$, $47_1$, $47_2$ and $47_3$ and the four log likelihoods Iγ input respectively to the four addition/comparison/selection circuits $55_0$, $55_1$, $55_2$ and $55_3$ are denoted respectively and collectively by IA, IB, IC and ID, whereas the four log likelihoods Iα input respectively to the four addition/comparison/selection circuits $47_0$, $47_1$, $47_2$ and $47_3$ and the four log likelihoods Iβ input respectively to the four addition/comparison/selection circuits $55_0$, $55_1$, $55_2$ and $55_3$ are denoted respectively and collectively by IE, IF, IG and IH. Furthermore, the log likelihoods Iα output from the addition/comparison/selection circuits $47_0$, $47_1$, $47_2$ and $47_3$ and the log likelihoods Iβ output from the addition/comparison/selection circuits $55_0$, $55_1$, $55_2$ and $55_3$ are collectively denoted by IJ. In the following description, any probability is expressed by a value not smaller than 0 and a lower probability is expressed by a larger value by taking situations where a decoder according to the invention is assembled as hardware.

Figure 14:
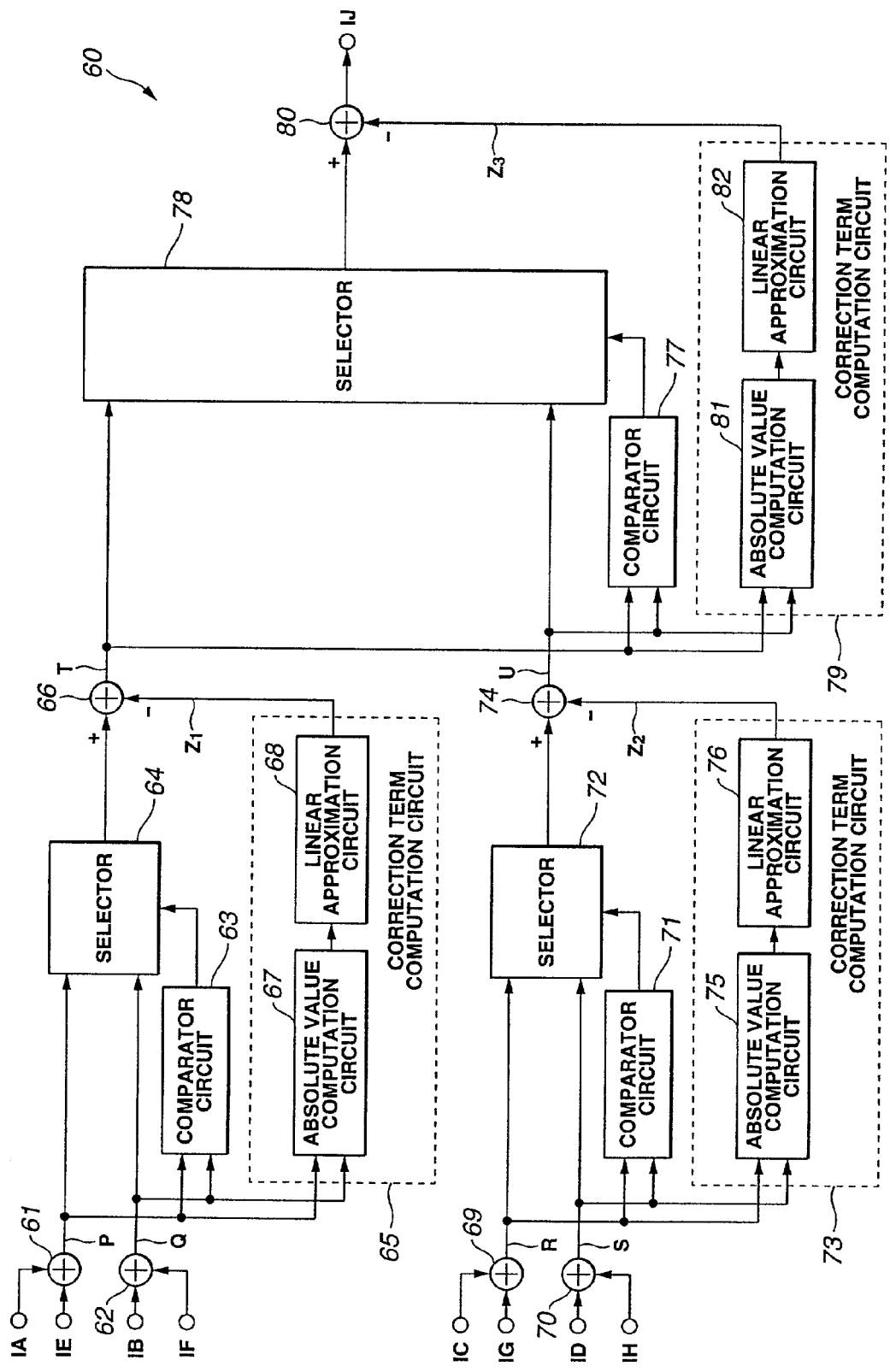
FIG. 14 is a schematic block diagram of the addition/comparison/selection circuit of the Iα computation circuit or the Iβ computation circuit realized on the basis of the Log-BCJR algorithm, illustrating the circuit configuration.

Firstly, an addition/comparison/selection circuit 60 arranged on the basis of the Log-BCJR algorithm will be described by referring to FIG. 14. As shown in FIG. 14, the addition/comparison/selection circuit 60 comprises adders 61, 62, 69, 70 for adding two data, comparator circuits 63, 71 for comparing respectively the outputs of the adders 61, 62 and those of the adders 69, 70 in terms of size, selectors 64, 72 for selecting respectively one of the outputs of the adders 61, 62 and one of the outputs of the adders 69, 70, correction term computation circuits 65, 73, 79 for computing the value of the correction term of the Log-BCJR algorithm, differentiators 66, 74, 80 for obtaining the differences of the respective sets of two data, comparator circuit 77 for comparing the outputs of the differentiators 66, 74 and a selector 78 for selecting either one of the outputs of the differentiators 66, 74.

The adder 61 is adapted to receive and add the log likelihoods IA, IE. If the addition/comparison/selection circuit 60 is the addition/comparison/selection circuit $47_0$, the adder 61 receives the log likelihood $I\gamma_t$ [000] and the log likelihood $I\alpha_{t-1}$ (0) as input and adds the log likelihood $I\gamma_t$ [000] and the log likelihood $I\alpha_{t-1}$ (0). The adder 61 then supplies the data obtained by the addition to the comparator circuit 63, the selector 64 and the correction term computation circuit 65. Note that, in the following description, the data output from the adder 61 is denoted by P.

The adder 62 is adapted to receive and add the log likelihoods IB, IF. If the addition/comparison/selection circuit 60 is the addition/comparison/selection circuit $47_0$, the adder 62 receives the log likelihood $I\gamma_t$ [101] and the log likelihood $I\alpha_{t-1}$ (1) as input and adds the log likelihood $I\gamma_t$ [101] and the log likelihood $I\alpha_{t-1}$ (1). The adder 62 then supplies the data obtained by the addition to the comparator circuit 63, the selector 64 and the correction term computation circuit 65. Note that, in the following description, the data output from the adder 62 is denoted by Q.

The comparator circuit 63 compares the value of the data P fed from the adder 61 and the value of the data Q fed from the adder 62 to see which is larger. Then, the comparator circuit 63 supplies the information on the comparison indicating the outcome of the comparison to the selector 64.

The selector 64 selects either the data P fed from the adder 61 or the data Q fed from the adder 62, whichever having a smaller value and hence showing a higher probability, on the basis of the information on the comparison supplied from the comparator circuit 63. Then, the selector 64 supplies the selected data to the differentiator 66.

The correction term computation circuit 65 comprises an absolute value computation circuit 67 for computing the absolute value of difference of the data P fed from the adder 61 and the data Q fed from the adder 62 and a linear approximation circuit 68 that operates as linear approximation means for computing the correction term by linear approximation, using the absolute value computed by the absolute value computation circuit 67. The correction term computation circuit 65 computes the value of the correction term of the Log-BCJR algorithm or the value of the second term of the right side of the equation (28) or the equation (30) shown above. More specifically, the correction term computation circuit 65 expresses the correction term as a one-dimensional function of variable |P−Q| and computes the linearly approximated value in the form of $-a_1|P-Q|+b_1$ that uses coefficient $-a_1$ ($a_1 > 0$) indicating the gradient of the function and coefficient $b_1$ indicating the intercept of the function. Then, the correction term computation circuit 65 supplies the data $Z_1$ obtained by the computation to the differentiator 66.

The differentiator 66 determines the difference of the data selected by the selector 64 and the data $Z_1$ fed from the correction term computation circuit 65 and supplies the difference to the comparator circuit 77, the selector 78 and the correction term computation circuit 79. Note that, in the following description, the data output from the differentiator 66 is denoted by T.

The adder 69 is adapted to receive and add the log likelihoods IC, IG. If the addition/comparison/selection circuit 60 is the addition/comparison/selection circuit $47_0$, the adder 69 receives the log likelihood $I\gamma_t$ [111] and the log likelihood $I\alpha_{t-1}$ (2) as input and adds the log likelihood $I\gamma_t$ [111] and the log likelihood $I\alpha_{t-1}$ (2). The adder 69 then supplies the data obtained by the addition to the comparator circuit 71, the selector 72 and the correction term computation circuit 73. Note that, in the following description, the data output from the adder 69 is denoted by R.

The adder 70 is adapted to receive and add the log likelihoods ID, IH. If the addition/comparison/selection circuit 60 is the addition/comparison/selection circuit $47_0$, the adder 70 receives the log likelihood $I\gamma_t$ [010] and the log likelihood $I\alpha_{t-1}$ (3) as input and adds the log likelihood $I\gamma_t$ [010] and the log likelihood $I\alpha_{t-1}$ (3). The adder 70 then supplies the data obtained by the addition to the comparator circuit 71, the selector 72 and the correction term computation circuit 73. Note that, in the following description, the data output from the adder 70 is denoted by S.

The comparator circuit 71 compares the value of the data R fed from th adder 69 and that of the data S fed from the adder 70 to see which is larger. Then, the comparator circuit 71 supplies the information on the comparison indicating the outcome of the comparison to the selector 72.

The selector 72 selects either the data R fed from the adder 69 or the data S fed from the adder 70, whichever having a smaller value and hence showing a higher probability, on the basis of the information on the comparison supplied from the comparator circuit 71. Then, the selector 72 supplies the selected data to the differentiator 74.

The correction term computation circuit 73 comprises an absolute value computation circuit 75 for computing the absolute value of difference of the data R fed from the adder 69 and the data S fed from the adder 70 and a linear approximation circuit 76 that operates as linear approximation means for computing the correction term by linear approximation, using the absolute value computed by the absolute value computation circuit 75. The correction term computation circuit 73 computes the value of the correction term of the Log-BCJR algorithm or the value of the second term of the right side of the equation (28) or the equation (30) shown above. More specifically, the correction term computation circuit 73 expresses the correction term as a one-dimensional function of variable |R−S| and computes the linearly approximated value in the form of $-a_2|R-S|+b_2$ that uses coefficient $-a_2 (a_2>0)$ indicating the gradient of the function and coefficient $b_2$ indicating the intercept of the function. Then, the correction term computation circuit 73 supplies the data $Z_2$ obtained by the computation to the differentiator 74.

The differentiator 74 determines the difference of the data selected by the selector 72 and the data $Z_2$ fed from the correction term computation circuit 73 and supplies the difference to the comparator circuit 77, the selector 78 and the correction term computation circuit 79. Note that, in the following description, the data output from the differentiator 74 is denoted by U.

The comparator circuit 77 compares the value of the data T fed from the differentiator 66 and that of the data U fed from the differentiator 74 to see which is larger. Then, the comparator circuit 77 supplies the information on the comparison indicating the outcome of the comparison to the selector 78.

The selector 78 selects either the data T fed from the differentiator 66 or the data U fed from the differentiator 74, whichever having a smaller value and hence showing a higher probability, on the basis of the information on the comparison supplied from the comparator circuit 77. Then, the selector 78 supplies the selected data to the differentiator 80. It will be appreciated that the data selected by the selector 78 is exactly the same as the value of the first term of the right side of the equation (28) or (30) shown above.

The correction term computation circuit 79 comprises an absolute value computation circuit 81 for computing the absolute value of difference of the data T fed from the differentiator 66 and the data U fed from the differentiator 74 and a linear approximation circuit 82 that operates as linear approximation means for computing the correction term by linear approximation, using the absolute value computed by the absolute value computation circuit 81. The correction term computation circuit 79 computes the value of the correction term of the Log-BCJR algorithm or the value of the second term of the right side of the equation (28) or the equation (30) shown above. More specifically, the correction term computation circuit 79 expresses the correction term as a one-dimensional function of variable |T−U| and computes the linearly approximated value in the form of $-a_3|T-U|+b_3$ that uses coefficient $-a_3 (a_3>0)$ indicating the gradient of the function and coefficient $b_3$ indicating the intercept of the function. Then, the correction term computation circuit 79 supplies the data $Z_3$ obtained by the computation to the differentiator 80.

The differentiator 80 determines the difference of the data selected by the selector 78 and the data $Z_3$ fed from the correction term computation circuit 79 and outputs the difference as log likelihood IJ. If the addition/comparison/selection circuit 60 is the addition/comparison/selection circuit $47_0$, the differentiator 80 outputs the log likelihood $I\alpha_t(0)$.

Now, the estimation of the delay at the addition/comparison/selection circuit 60 will be discussed below. Here, it is assumed that the delay of a comparator circuit and that of a differentiator are the same as that of an ordinary adder such as the adder 61 or 62.

As clear from FIG. 14, the delay due to the adders 61, 62, 69, 70, the delay due to the comparator circuits 63, 71, the delay due to the differentiators 66, 74, the delay due to the comparator 77 and the delay due to the differentiator 80 are inevitable in the addition/comparison/selection circuit 60 and these delays can be regarded as those of five adders. Besides, the delay due to the selectors 64, 72 and the delay due to the selector 78 are also inevitable in the addition/comparison/selection circuit 60 and these delay can be regarded as those of two selectors. Thus, the addition/comparison/selection circuit 60 involves at least the delay of five adders and that of two selectors. Furthermore, the addition/comparison/selection circuit 60 additionally involves the delay due to the correction term computation circuits 65, 73, 79. Therefore, the estimation of the delay due to the correction term computation circuits 65, 73, 79 will be discussed below.

Firstly, the delay due to the absolute value computation circuits 67, 75, 81 will be estimated. Since the absolute value computation circuits 65, 75, 81 have a same configuration, they are collectively referred to as absolute value computation circuit 90 here. Additionally, the two data P, Q input to the absolute value computation circuit 67, the two data R, S input to the absolute value computation circuit 75 and the two data T, U input to the absolute value computation circuit 81 are collectively denoted by PP and QQ, whereas the absolute value data |P−Q| output from the absolute value computation circuit 67, the absolute value data |R−S| output from the absolute value computation circuit 75 and the absolute value data |T−U| output from the absolute value computation circuit 81 are collectively denoted by |PP−QQ| here.

Figure 15:
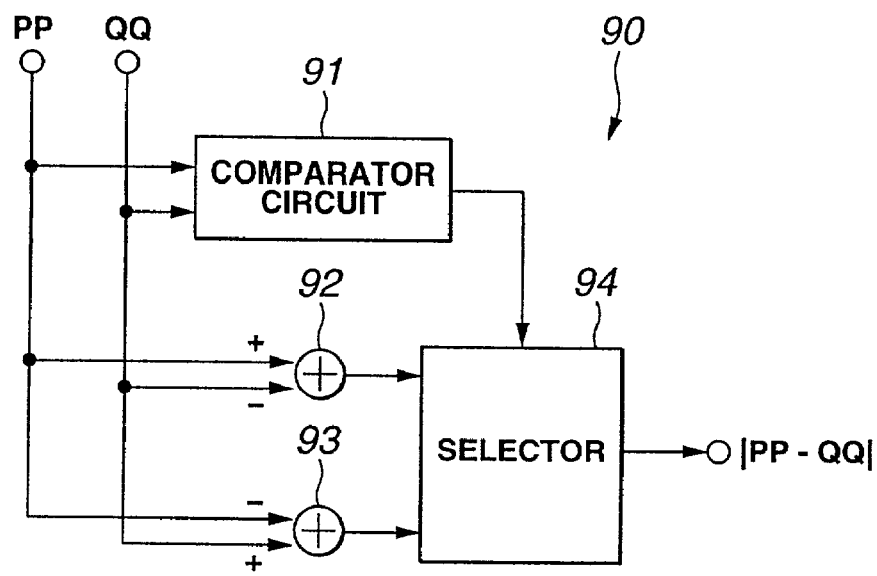
FIG. 15 is a schematic block diagram of the absolute value computation circuit of the addition/comparison/selection circuit of FIG. 14, illustrating the circuit configuration.

Referring to FIG. 15, the absolute value computation circuit 90 is so regarded as to comprise a comparator 91 for comparting the two values output from the upstream two adders to see which is larger, a pair of differentiators 92, 93 for determining the difference of the two data and a selector 94 for selecting one of the outputs of the differentiators 92, 93.

More specifically, the absolute value computation circuit 90 compares the data PP fed from one of the upstream adders and the data QQ fed from the other upstream adder by means of the comparator circuit 91. At the same time, the absolute value computation circuit 90 determines the difference (PP−QQ) of the data PP and the data QQ by means of the differentiator 92 and also the difference (QQ−PP) of the data QQ and the data PP by means of the differentiator 93. Then, the absolute value computation circuit 90 selects either the difference (PP−QQ) or the difference (QQ−PP), whichever showing a positive value, by means of the selector 94 on the basis of the outcome of the comparator circuit 91 and supplies the selected difference to the downstream linear approximation circuit as absolute value data |PP−QQ|.

Thus, as the processing operation of the comparator circuit 91 and that of the differentiator 92 and 93 are performed concurrently in the absolute value computation circuit 90, the absolute value computation circuit 90 involves the delay due to an adder and that due to a selector.

Now, the delay due to the linear approximation circuits 68, 76, 82 will be estimated. Since the linear approximation circuits 68, 76, 82 have a same configuration, they are collectively referred to as linear approximation circuit 100 here. Additionally, the absolute value data |P−Q| input to the linear approximation circuit 68, the absolute value data |R−S| input to the linear approximation circuit 76 and the absolute value data |T−U| input to the linear approximation circuit 82 are collectively denoted by |PP−QQ|, whereas the data $Z_1$ output from the linear approximation circuit 68, the data $Z_2$ output from the linear approximation circuit 76 and the, data $Z_3$ output from the linear approximation circuit 82 are collectively denoted by Z.

Figure 16:
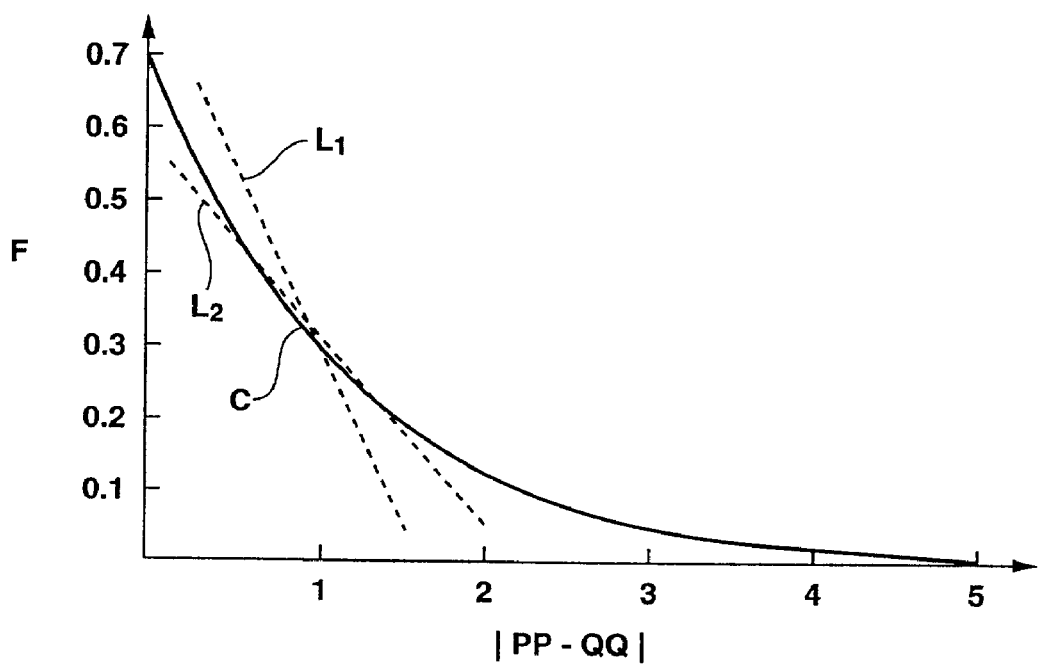
FIG. 16 is a graph showing the relationship between a function having a correction term and a function that can be used by the linear approximation circuit of the addition/comparison/selection circuit of FIG. 14 for linear approximation, illustrating the operation of log-sum correction of the circuit.
Figure 17:
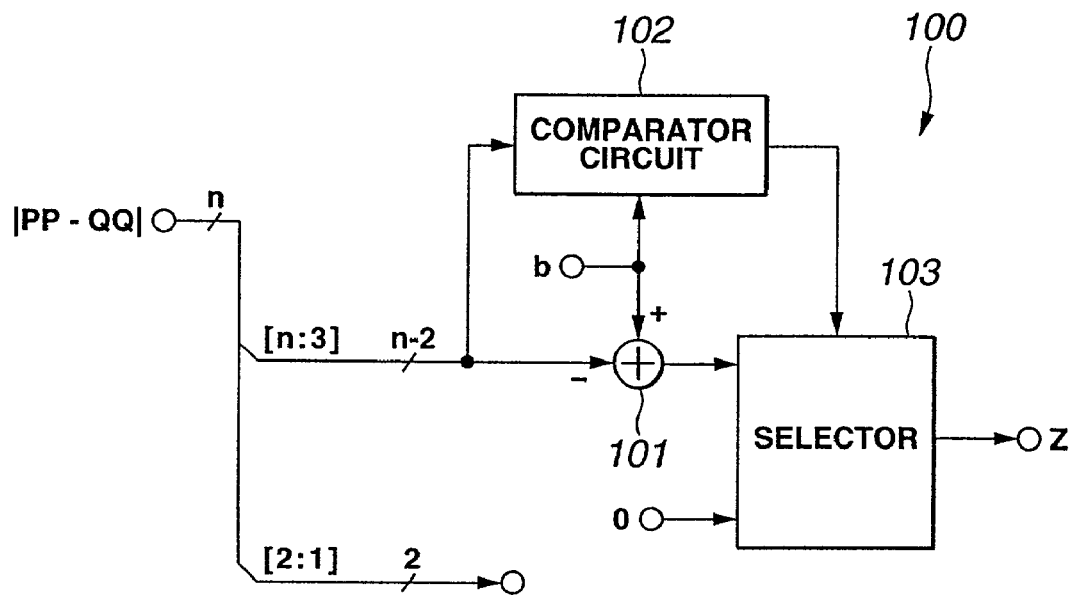
FIG. 17 is a schematic block diagram of a linear approximation circuit that can be used for the purpose of the invention, illustrating the configuration of the circuit for computing the value of the correction term, where the coefficient −a of function F=−a|PP−QQ|+b is expressed by using a power exponent of 2.

As shown in FIG. 16, the linear approximation circuit 100 performs a log-sum correction by means of so-called linear approximation so as to approximate the function F=−a|PP−QQ|+b indicated by straight lines $L_1$, $L_2$ to the function F=log {1+eô(−|PP−QQ|)} indicated by curve C and computes the value of the correction term. More specifically, the linear approximation circuit 100 computes the value of the correction term at least by expressing the coefficient −a of function F=−a|PP−QQ|+b, using a power exponent of 2. Referring to FIG. 16, −a that is expressed by a power exponent of 2 may be −a=−$2^{-1}$=−0.5 as indicated by straight line $L_1$ or −a=−$2^{-2}$=−0.25 as indicated by straight line $L_2$. Here, it is assumed that −a=−0.25. Then, as shown in FIG. 17, the linear approximation circuit 100 is so regarded as to comprise a differentiator 101, a comparator circuit 102 and a selector 103.

The differentiator 101 computes the difference of the coefficient b representing the intercept of the function F=−a|PP−QQ|+b and the upper n−2 bits of the n-bit absolute value data |PP−QQ| fed from the absolute value computation circuit 90 and supplies the selector 103 with the difference.

The computation 102 compares the value of the coefficient b and that of data |PP−QQ|[n:3] expressed by the upper n−2 bits of the absolute value data |PP−QQ| to see which is larger and supplies the selector 103 with information on the outcome of the comparison.

The selector 103 selects either the data fed from the differentiator 101 or "0" on the basis of the information on the outcome of the comparison coming from the comparator circuit 102. More specifically, the selector 103 selects the data fed from the differentiator 101 when the outcome of the comparison of the comparator circuit 102 proves |PP−QQ|[n:3]≦b, whereas it selects "0" when |PP−QQ|[n:3]>b. Then, the selector 103 supplies the selected data to the downstream differentiator as data Z indicating the value of the correction term.

The linear approximation circuit 100 discards the lowest bit and the second lowest bit of the n-bit absolute value data |PP−QQ| fed from the absolute value computation circuit 90 and subtracts the data expressed by the remaining upper n−2 bits from the coefficient b. In other words, the linear approximation circuit 100 can multiply |PP−QQ| by ¼=0.25 by discarding the two lowest bits and bit-shifting the absolute value data |PP−QQ| and carry out the operation of −0.25|PP−QQ|+b by subtracting the data expressed by the remaining upper n−2 bits from the coefficient b.

Since the correction term shows a positive value, the linear approximation circuit 100 outputs "0" by means of the selector 103 and avoids the situation where the correction term takes a negative value if the comparator circuit 102 finds out as a result of the comparison that the differentiator 101 outputs a negative value and hence the value of the correction term is computed as negative.

If −a=−$2^{-1}$=−0.5 is taken, the linear approximation circuit 100 discards the lowest bit of the absolute value data |PP−QQ| for bit-shifting. Therefore, an appropriate number of lower bits of the absolute value data |PP−QQ| will be discarded depending on the power exponent to be used for expressing the coefficient −a.

Thus, the linear approximation circuit 100 does not require the use of any multiplier and involves only a processing operation of the differentiator 101 and that of the comparator circuit 102 that proceed concurrently. Therefore, the delay of the linear approximation circuit 100 can be estimated as that of a single adder and that of a single selector.

Figure 18:
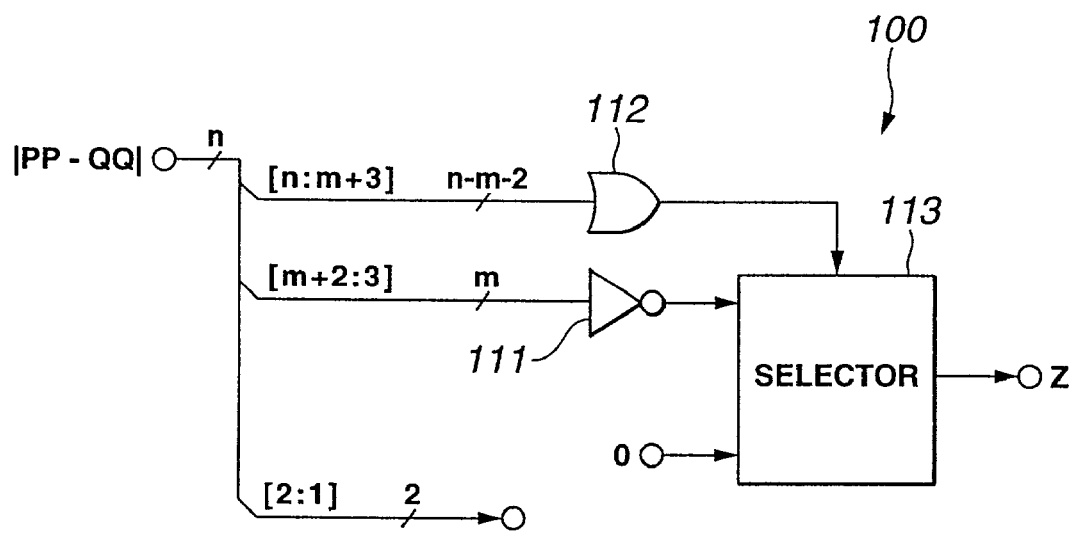
FIG. 18 is a schematic block diagram of another linear approximation circuit that can be used for the purpose of the invention, illustrating the configuration of the circuit for computing the value of the correction term, where the coefficients −a and b of function F=−a|PP−QQ|+b are expressed by using power exponent of 2.

The linear approximation circuit 100 may compute the value of the correction term also by using a power exponent of 2 to express the coefficient b. If the coefficient b is expressed by $2^m$−1 and −a=−0.25, the linear approximation circuit 100 can be so regarded as to comprise an inverter 111, an OR gate 112 and a selector 113 as shown in FIG. 18.

The inverter 111 inverts the In bits from the third lowest bit to the m+2-th lowest bit of the n-bit absolute value data |PP−QQ| fed from the absolute value computation circuit 90. Then, the inverter 111 supplies the data obtained as a result of the inversion to the selector 113.

The OR gate 112 determines the exclusive OR of the upper n−m−2 bits from the m+3-th lowest bit to the n-th lowest bit of the n-bit absolute value data |PP−QQ| fed from the absolute value computation circuit 90. Then, the OR gate 112 supplies the obtained exclusive OR to the selector 113.

The selector 113 selects either the data fed from the inverter 111 or "0" on the basis of the exclusive OR fed from the OR gate 112. More specifically, the selector 113 selects the data fed from the inverter 111 when the exclusive OR fed from the OR gate 112 is equal to "0" but it selects "0" when the exclusive OR fed from the OR gate 112 is equal to "1". Then, the selector 113 supplies the selected data to the downstream differentiator as data Z indicating the correction term.

Thus, the linear approximation circuit 100 discards the lowest bit and the second lowest bit of the n-bit absolute value data |PP−QQ| fed from the absolute value computation circuit 90 and inverts the m bits from the third lowest bit to the m+2-th lowest bit of the remaining upper n−2 bits by means of the inverter 111. At the same time, the linear approximation circuit 100 determines the exclusive OR of the n−m−2 bits from the m+3-th lowest bit to the n-th bit by means of the OR gate 112.

In other words, the linear approximation circuit 100 can multiply |PP−QQ| by ½=0.25 by discarding the two lowest bits and bit-shifting the absolute value data |PP−QQ|. Therefore, the linear approximation circuit 100 only needs to multiply the data |PP−QQ|[n:3] expressed by the upper n−2 bits of the absolute value data |PP−QQ|, or 0.25 |PP−QQ|, by −1 and adds the coefficient b that is expressed by $2^m$−1 to the product.

Figure 19A:
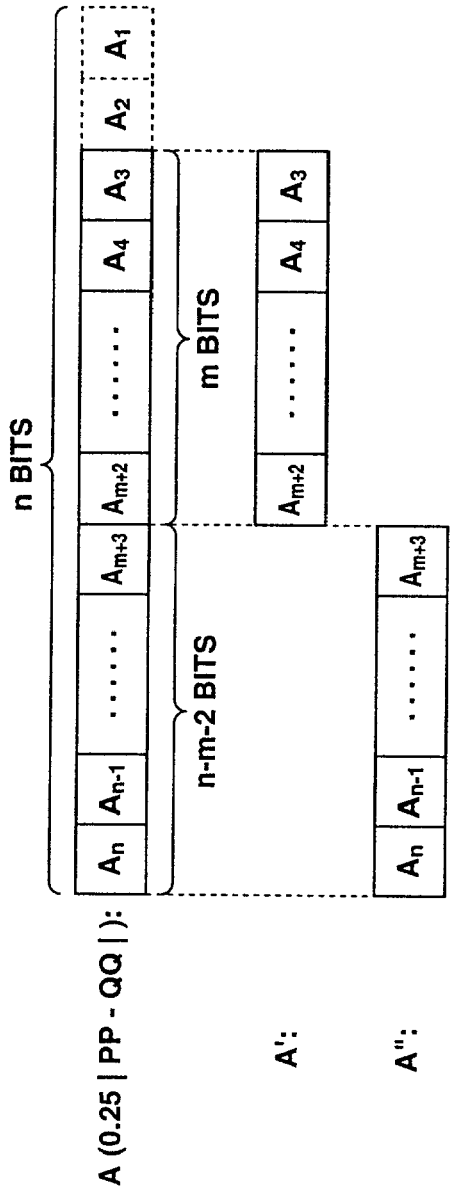
FIGS. 19A and 19B are schematic illustrations of the computational operation of the linear approximation circuit of FIG. 18.

In order to express the arithmetic operations of the linear approximation circuit 100 by modus, 0.25 |PP−QQ| obtained by discarding the two lowest bits of the n-bit absolute value data |PP−QQ| is denoted by A=($A_n$, $A_{n-1}$, ..., $A_{m+3}$, $A_{m+2}$, ..., $A_3$) and the m bits from the third lowest bit to the m+2-th lowest bit and the n−m−2 bits from the m+3-th lowest bit to the n-th bit of the remaining upper n−2 bits are denoted respectively by A' and A" as shown in FIG. 19A.

Firstly, assume that "−0.25|PP−QQ|+$2^m$−1=−A+($2^m$−1)" to be obtained by the linear approximation circuit 100 shows a negative value. Then, the equivalence relation as expressed by formula (32) below holds true. More specifically, A" shows a positive value when "−A+($2^m$−1)" shows a negative value. In other words, the exclusive OR of all the bits of A" is equal to "1" when "−A+($2^m$−1)" shows a negative value.

$$-A + (2^m - 1) < 0 \Leftrightarrow A > 2^m - 1 \quad (32)$$
$$\Leftrightarrow A'' > 0$$

Now, assume that "−0.25|PP−QQ|+$2^m$−1=−A+($2^m$−1)" to be obtained by the linear approximation circuit 100 shows a value not smaller than 0. Then, A"=0 from the equivalence relation expressed by the above formula (32) and hence formula (33) below holds true.

$$-A+(2^m-1)=-A'+(2^m-1) \quad (33)$$

Figure 19B:
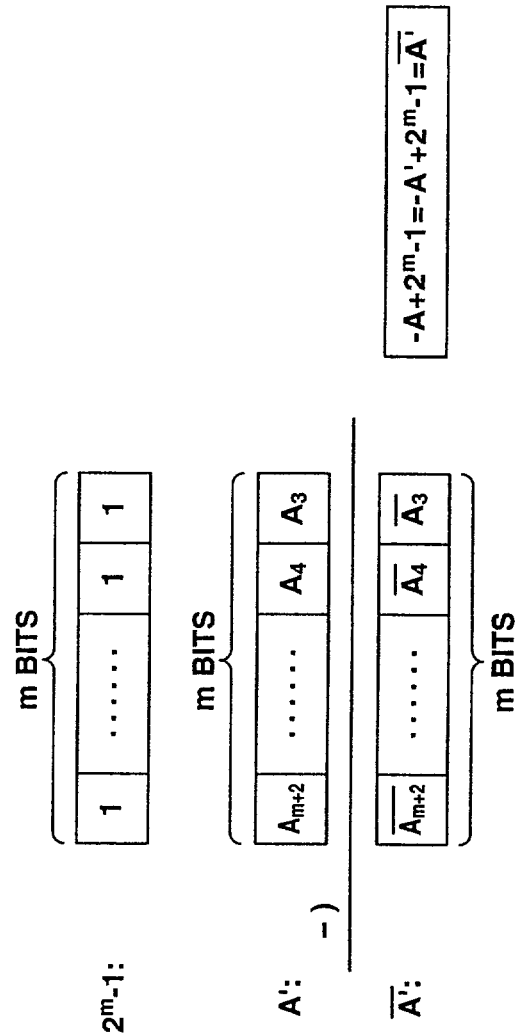

From the fact that $2^{m-1}-1$ refers to a data where all the m bits are equal to "1", "−A'+($2^m$−1)" is expressed by the negation of A' as shown in FIG. 19B.

Form the above discussion, it will be seen that the linear approximation circuit 100 only needs to obtain the negation of the lower m bits of A. Therefore, the linear approximation circuit 100 can carry out the operation of "−0.25|PP−QQ|+$2^m$−1" simply by inverting the data |PP−QQ|[m+2:2] expressed by the m bits from the third lowest bit to the m+2-th lowest bit out of the absolute value data |PP−QQ| by means of the inverter 111.

Additionally, the linear approximation circuit 100 can see if "−0.25|PP−QQ|+$2^m$−1" has a positive value or a negative value by obtaining the exclusive OR of the data |PP−QQ|[m+3:n] expressed by the n−m−2 bits from the m+3-th lowest bit to the n-th bit out of the absolute value data |PP−QQ|. Therefore, since the correction term shows a positive value, the linear approximation circuit 100 can avoid any situation where the correction term shows a negative value by causing the selector 113 to output "0" when the exclusive OR obtained by the OR gate 112 is "1" and hence the correction term is regarded to show a negative value as a result of computation.

If the coefficient a is expressed by $-2^{-k}$, the linear approximation circuit 100 discards the bits from the lowest bit to the k-th lowest bit of the absolute value data |PP−QQ| for bit-shifting and inverting the m bits from the k+1-th lowest bit to the m+k-th lowest bit. For example, if n=5 and m=2 so that the operation of "−0.25|PP−QQ|+3" is carried out, the absolute value data |PP−QQ| and the data Z will show the relationship as shown in Table 1 below. Note that Table 1 below additionally shows the above described negation of A', or the data output from the inverter 111.

TABLE 1

Relationship between Absolute Value Data |P−Q| and Data Z

| |P−Q| | $\overline{A'}$ | Z |
|---|---|---|
| 31 | 11111 | 00 | 0 |
| 30 | 11110 | 00 | 0 |
| 29 | 11101 | 00 | 0 |
| 28 | 11100 | 00 | 0 |
| 27 | 11011 | 01 | 0 |

TABLE 1-continued

Relationship between Absolute Value Data |P−Q| and Data Z

| |P−Q| | $\overline{A'}$ | Z |
|---|---|---|
| 26 | 11010 | 01 | 0 |
| 25 | 11001 | 01 | 0 |
| 24 | 11000 | 01 | 0 |
| 23 | 10111 | 10 | 0 |
| 22 | 10110 | 10 | 0 |
| 21 | 10101 | 10 | 0 |
| 20 | 10100 | 10 | 0 |
| 19 | 10011 | 11 | 0 |
| 18 | 10010 | 11 | 0 |
| 17 | 10001 | 11 | 0 |
| 16 | 10000 | 11 | 0 |
| 15 | 01111 | 00 | 0 |
| 14 | 01110 | 00 | 0 |
| 13 | 01101 | 00 | 0 |
| 12 | 01100 | 00 | 0 |
| 11 | 01011 | 01 | 1 |
| 10 | 01010 | 01 | 1 |
| 9 | 01001 | 01 | 1 |
| 8 | 01000 | 01 | 1 |
| 7 | 00111 | 10 | 2 |
| 6 | 00110 | 10 | 2 |
| 5 | 00101 | 10 | 2 |
| 4 | 00100 | 10 | 2 |
| 3 | 00011 | 11 | 3 |
| 2 | 00010 | 11 | 3 |
| 1 | 00001 | 11 | 3 |
| 0 | 00000 | 11 | 3 |

As shown in Table 1 above, the linear approximation circuit 100 outputs as data Z obtained by inverting the data |PP−QQ|[4:2] as expressed by 2 bits from the third lowest bit to the fourth (2+2=4) lowest bit out of the absolute value data |PP−QQ| by means of the inverter 111 for the range of the absolute value data |PP−QQ| between 0 and 12, whereas it outputs "0" for the range of the absolute value data |PP−QQ| not smaller than 13 the inverter 111 is negative in the latter range.

Thus, the linear approximation circuit 100 can operate with bit-shifts and an inverter without requiring the use of a multiplier and an adder so that it can be estimated to show the delay of a selector.

Therefore, the delay of the correction term computation circuits 65, 73, 79 is estimated to be equal to that of two adders and two selectors when the linear approximation circuit 68, 76, 82 are made to have the configuration as shown in FIG. 17, whereas the delay of the linear approximation circuit 68, 76, 82 is estimated to be equal to that of an adder and two selectors when the circuits are made to have the configuration of FIG. 18.

Thus, in view of the fact that the processing operation of the comparator circuits 63, 71 and that of the absolute value computation circuits 67, 75 are carried out concurrently, while the processing operation of the comparator circuit 77 and that of the absolute value computation circuit 81 are carried out concurrently, the delay of the addition/comparison/selection circuit 60 is estimated to be equal to that of seven adders and four selectors when the linear approximation circuits 68, 76, 82 are made to show the configuration of FIG. 17 and to that of five adders and four selectors when the linear approximation circuits 68, 76, 82 are made to show the configuration of FIG. 18.

It is attempted to further reduce the delay of the addition/comparison/selection circuit 60. The processing operation of the addition/comparison/selection circuit 60 can be carried out at higher speed by performing corrections, using two or more than two paths showing a high likelihood. Now, such an addition/comparison/selection circuit will be denoted by addition/comparison/selection circuit 120. Assume here that the addition/comparison/selection circuit 120 performs corrections, using the path showing the maximum likelihood and the path showing the second maximum likelihood.

Before discussing about corrections, it is explained to select the path showing the maximum likelihood at high speed. Note that the path showing the maximum likelihood is referred to as the maximum likelihood path and the path showing the second maximum likelihood is referred to as the second maximum likelihood path.

The addition/comparison/selection circuit 120 compares the value of the data P and that of the data Q and also compares the value of the data R and that of the data S out of the data P, Q, R and S. At the same time, the addition/comparison/selection circuit 120 compares the combinations of two data selected out of all the four data from the viewpoint of their values and determines the path to be selected on the basis of the information on the outcome of the comparison of the value of the data P and that of the data Q and also the information on the outcome of the comparison of the value of the data R and that of the data S.

Figure 20:
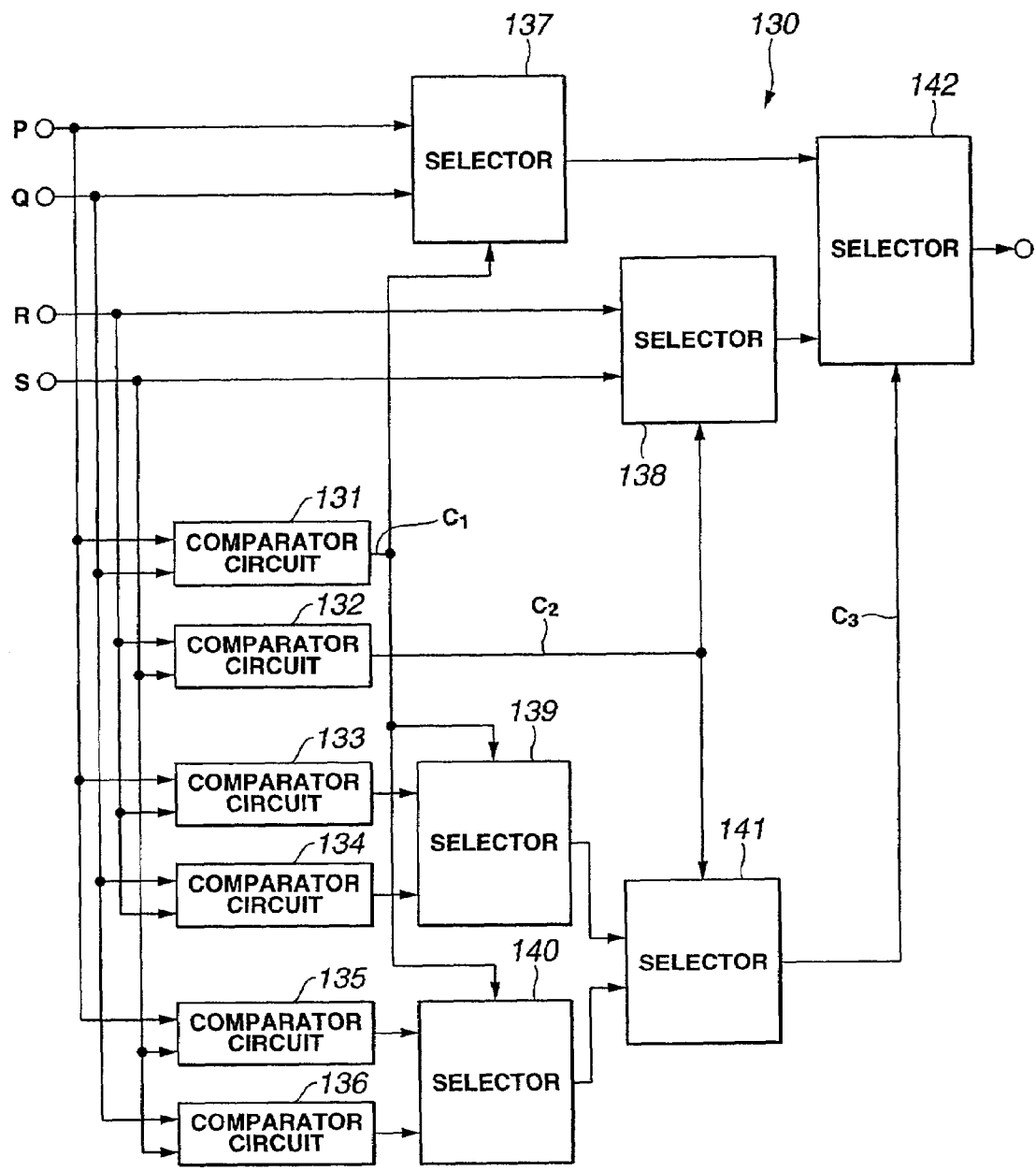
FIG. 20 is a schematic block diagram of the path selecting section of the addition/comparison/selection circuit of FIG. 14.
Figure 21A:
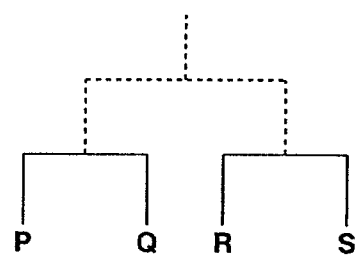
FIG. 21 is a schematic illustration of the operation of the path selecting section of FIG. 20 for comparing a plurality of input data for the data size and selecting one of them.
Figure 21B:
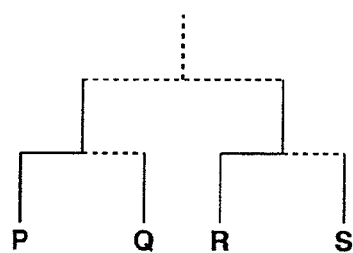
Figure 21C:
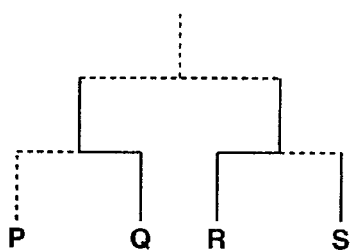
Figure 21D:
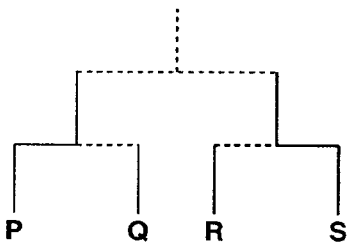
Figure 21E:
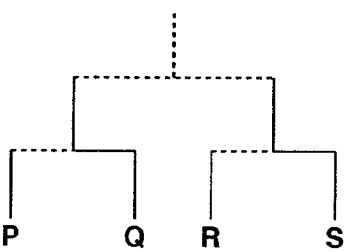

More specifically, the addition/comparison/selection circuit 120 may be made to comprise a path selecting section 130 as shown in FIG. 20 as path selection means for selecting paths. The path selecting section 130 is formed by arranging six comparator circuits 131, 132, 133, 134, 135, 136 as means of comparison and six selectors 137, 138, 139, 140, 141, 142.

The comparator circuit 131 corresponds to the above described comparator circuit 63 and compares the value of the data P and that of the data Q. Then, the comparator circuit 131 supplies the information $C_1$ showing the outcome of the comparison to the selectors 137, 139, 140.

The comparator circuit 132 corresponds to the above described comparator circuit 71 and compares the value of the data R and that of the data S. Then, the comparator circuit 132 supplies the information $C_2$ showing the outcome of the comparison to the selectors 139, 141.

The comparator circuit 133 compares the value of the data P and that of the data R. Then, the comparator circuit 133 supplies the information showing the outcome of the comparison to the selector 139.

The comparator circuit 134 compares the value of the data Q and that of the data R. Then, the comparator circuit 134 supplies the information showing the outcome of the comparison to the selector 139.

The comparator circuit 135 compares the value of the data P and that of the data S. Then, the comparator circuit 135 supplies the information showing the outcome of the comparison to the selector 140.

The comparator circuit 136 compares the value of the data Q and that of the data S. Then, the comparator circuit 136 supplies the information showing the outcome of the comparison to the selector 140.

The selector 137 corresponds to the above described selector 64 and selects either the data P or the data Q, whichever having a smaller value and hence showing a higher probability, on the basis of the information $C_1$ on the outcome of comparison supplied from the comparator circuit 131. Then, the selector 137 supplies the selected data to the selector 142.

The selector 138 corresponds to the above described selector 72 and selects either the data R or the data S, whichever having a smaller value and hence showing a higher probability, on the basis of the information $C_2$ on the outcome of comparison supplied from the comparator circuit 132. Then, the selector 138 supplies the selected data to the selector 142.

The selector 139 selects either the information on the outcome of comparison fed from the comparator circuit 133 or the information on the outcome of comparison fed from the comparator circuit 134 on the basis of the information $C_1$ on the outcome of comparison supplied from the comparator circuit 131. More specifically, the selector 139 selects the information on the outcome of comparison fed from the comparator circuit 133 when P≦Q as a result of the comparison by the comparator circuit 131 and the information on the outcome of comparison fed from the comparator circuit 134 when P>Q as a result of the comparison by the comparator circuit 131. Then, the selector 139 supplies the selected information on the outcome of comparison to the selector 141.

The selector 140 selects either the information on the outcome of comparison fed from the comparator circuit 135 or the information on the outcome of comparison fed from the comparator circuit 136 on the basis of the information $C_1$ on the outcome of comparison supplied from the comparator circuit 131. More specifically, the selector 140 selects the information on the outcome of comparison fed from the comparator circuit 135 when P≦Q as a result of the comparison by the comparator circuit 131 and the information on the outcome of comparison fed from the comparator circuit 136 when P>Q as a result of the comparison by the comparator circuit 131. Then, the selector 140 supplies the selected information on the outcome of comparison to the selector 141.

The selector 141 selects either the information on the outcome of comparison fed from the comparator circuit 139 or the information on the outcome of comparison fed from the comparator circuit 140 on the basis of the information $C_2$ on the outcome of comparison supplied from the comparator circuit 132. More specifically, the selector 141 selects the information on the outcome of comparison fed from the comparator circuit 139 when R≦S as a result of the comparison by the comparator circuit 132 and the information on the outcome of comparison fed from the comparator circuit 140 when R>S as a result of the comparison by the comparator circuit 132. Then, the selector 141 supplies the selected information $C_3$ on the outcome of comparison to the selector 142.

The selector 142 corresponds to the above described selector 78 and selects and outputs either the data fed from the selector 137 or the data fed from the selector 138 on the basis of the information $C_3$ on the outcome of comparison fed from the comparator circuit 141. More specifically, the selector 142 selects and outputs the data fed from the selector 137 when the information $C_3$ on the outcome of comparison fed from the comparator circuit 141 is the information fed from the selector 139, whereas it selects and outputs the data fed from the selector 138 when the information $C_3$ on the outcome of comparison fed from the comparator circuit 141 is the information fed from the selector 140.

Thus, the path selecting section 130 compares the likelihoods of all the combinations of two out of the four data of data P, data Q, data R and data S corresponding to the four paths getting to each state in order to find out the data corresponding to at least two paths showing the maximum likelihood and selects the data corresponding to the path showing the maximum likelihood, or the maximum likelihood path. More specifically, the path selecting section 130 makes the data P, the data Q, the data R and the data S to compete with each other in a so-called tournament in order to compare the value of the data P, that of the data Q, that of the data R and that of the data S in terms of size and select the data corresponding to the maximum likelihood path.

Referring to FIG. 21, the path selecting section 130 makes the data P and the data Q to compete with each other in the first round by means of the comparator circuit 131 and also the data R and the data S to compete with each other in the first round by means of the comparator circuit 132 as indicated by (A) in FIG. 21. At the same time, the path selecting section 130 makes the data P, the data Q, the data R and the data S to be selected and compete with each other in four possible final rounds by means of the comparator circuit 133, the comparator circuit 134, the comparator circuit 135 and the comparator circuit 136 as indicated by (B) through (E) in FIG. 21. Then, the path selecting section 130 determines the information $C_3$ on the comparison and selection indicating the combination of two data that will be selected for the final round with the maximum probability out of the four possible combinations for the final round on the basis of the information $C_1$ on the outcome of comparison and the information $C_2$ on the outcome of comparison indicating the results of the first rounds and prepared by the comparator circuits 131 and 132 and selects the data corresponding to the maximum likelihood path out of the data P, the data Q, the data R and the data S.

Now, it is considered to determine the difference between the data corresponding to the maximum likelihood path and the data corresponding to the second maximum likelihood path to be selected in order to make correction only for the most likelihood path and the second most likelihood path.

Figure 22:
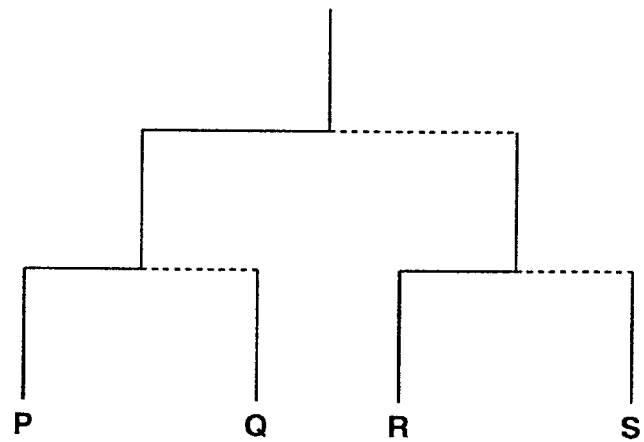
FIG. 22 is a schematic illustration of the operation of the pass selecting section of FIG. 20, showing an example of the result of the selecting operation of the path selecting section.

The data corresponding to the second maximum likelihood path to be selected for the purpose of correction is the competitor of the data corresponding to the maximum likelihood path with the lowest value and hence with the maximum probability in the first round. For instance, if the results of the tournament promoted by the path selecting circuit 130 are such as those shown in FIG. 22 and hence the information $C_1$, the information $C_2$ and the information $C_3$ on the outcome of comparison indicate $P \leq Q$, $R \leq S$, $P \leq R$ respectively, the addition/comparison/selection circuit 120 only needs to select either the absolute value data |P–Q| or the absolute value data |P–R|, whichever smaller, as the absolute value data to be selected for the purpose of correction.

Figure 23:
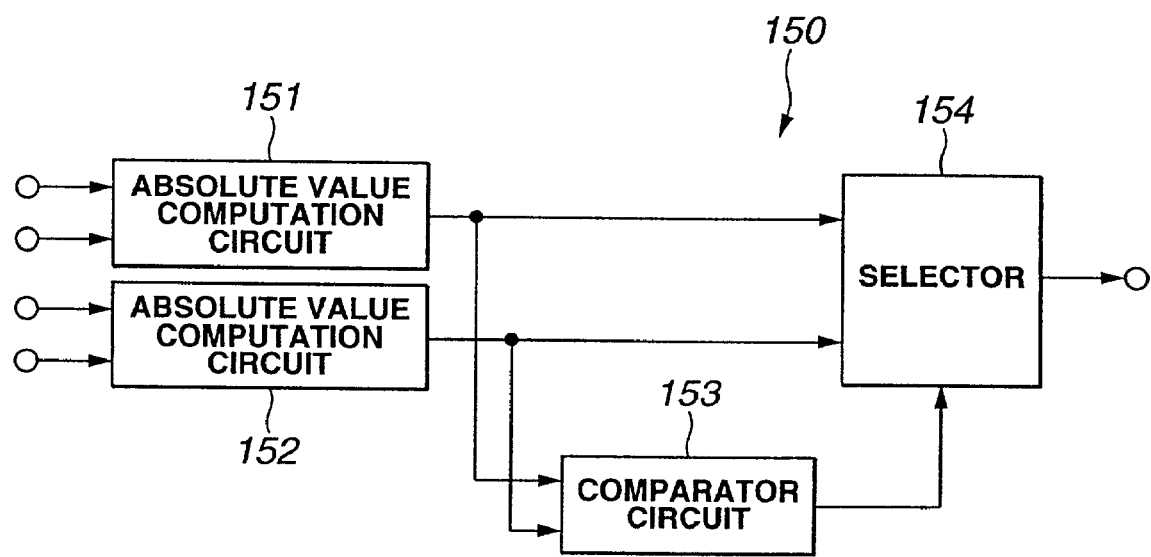
FIG. 23 is a schematic block diagram of an absolute value data selecting section that can be used for the addition/comparison/selection circuit of FIG. 14, illustrating the operation of the section for comparing two absolute value data and selecting one of them.

Thus, if the two absolute value data are to be compared with each other, the addition/comparison/selection circuit 120 is made to comprise an absolute value data selecting section 150 as means for selecting an absolute value as shown in FIG. 23. Then, the absolute value data selecting section 150 comprises two absolute value computation circuits 151, 152 for determining two absolute value data, a comparator circuit 153 for comparing the two absolute value data produced from the two absolute value computation circuits 151, 152 and a selector 154 for selecting one of the two absolute value data on the basis of the information on the outcome of comparison indicating the outcome of the comparison of the comparator circuit 153.

However, since the absolute value data selecting section 150 involves the delay due to the comparator circuit 153 and the delay due to the selector 154 in addition to the delay due to the absolute value computation circuits 151, 152, the addition/comparison/selection circuit 120 is forced to inevitably involve the delay due to a single adder and the delay due to a single selector when it is made to comprise an absolute value data selecting section 150.

In view of the above identified problem, it is pointed out the fact that the larger one of the absolute value data |P–Q| and |P–R| can be found by comparting the values of two known data such as the value of the data Q and that of the data R and the path selecting section 130 already knows which of the data Q and the data R is larger.

Figure 24:
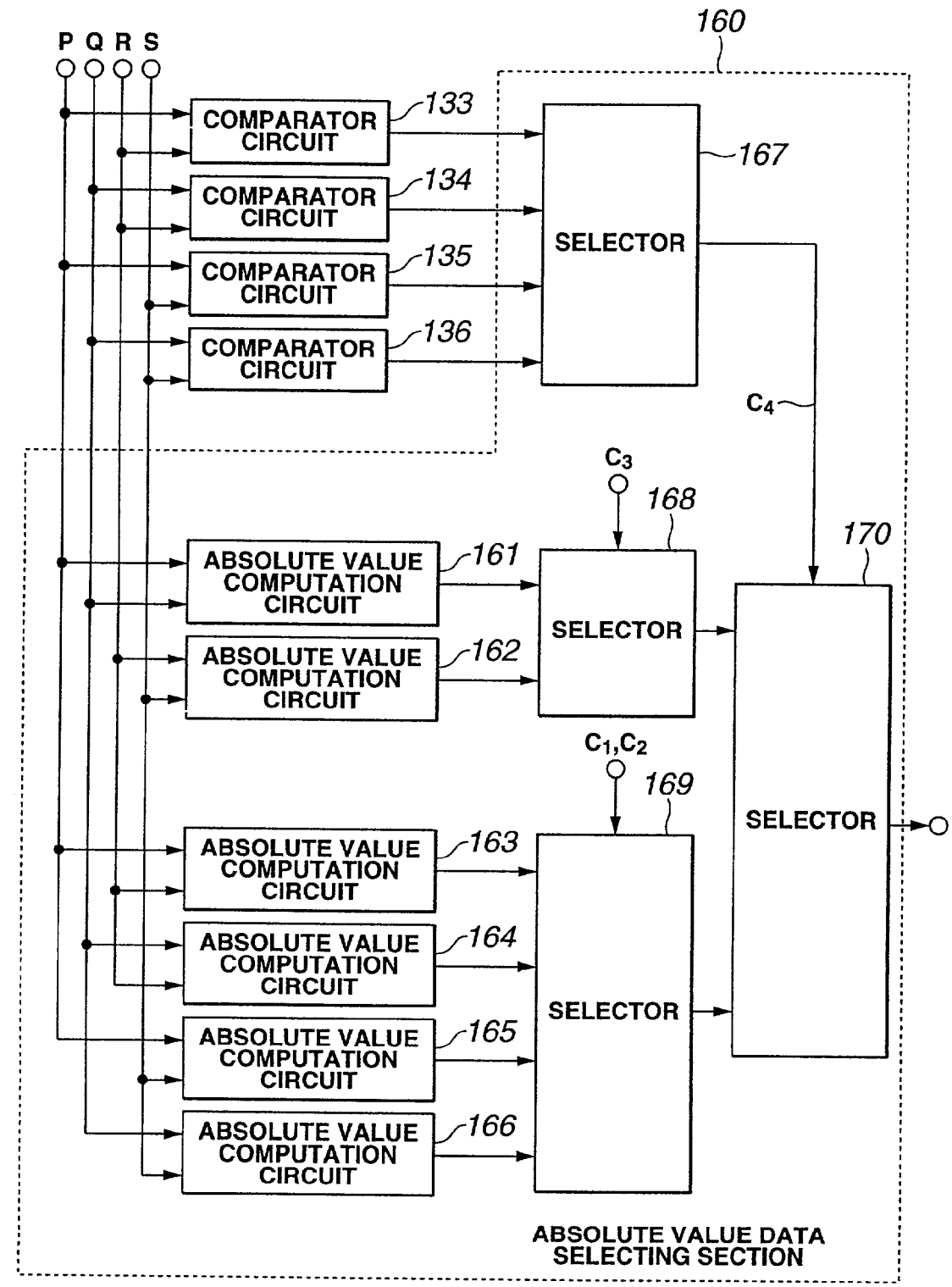
FIG. 24 is a schematic block diagram of another absolute value data different from that of FIG. 23.
Figure 25A:
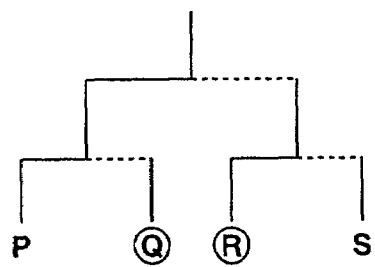
FIG. 25 is a schematic illustration of the operation of the absolute value data selecting section of FIGS. 23 or 24, showing eight values obtained by a selecting operation of the path selecting section.
Figure 25B:
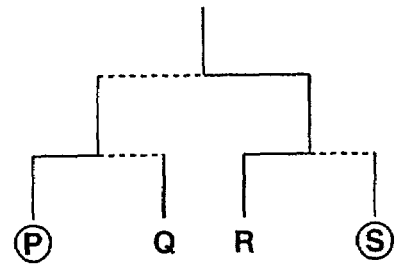
Figure 25C:
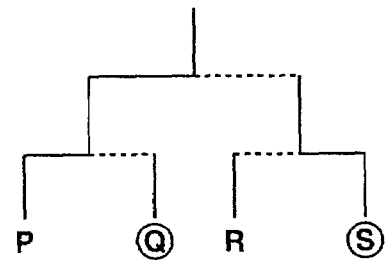
Figure 25D:
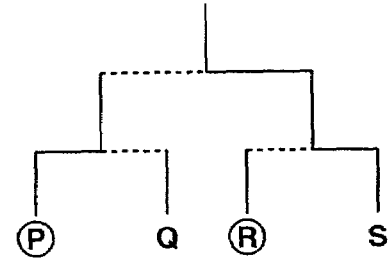
Figure 25E:
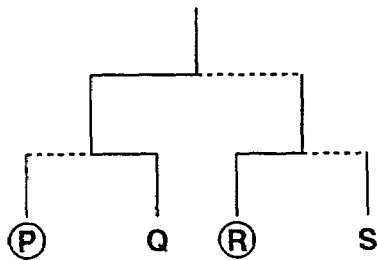
Figure 25F:
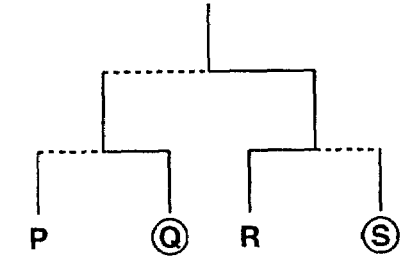
Figure 25G:
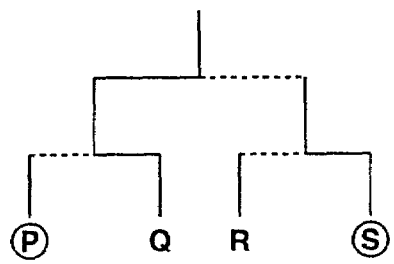
Figure 25H:
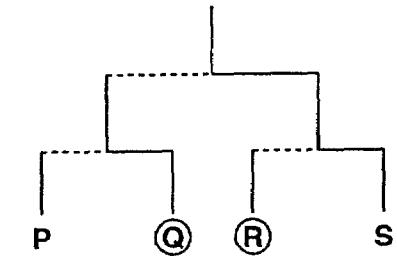

Then, the addition/comparison/selection 120 can be made to comprise an absolute value data selecting section 160 as shown in FIG. 24.

Referring to FIG. 24, the absolute value data selecting section 160 comprises six absolute value computation circuits 161, 162, 163, 164, 165, 165 for computing the absolute value of the difference of two data and four selectors 167, 168, 169, 170 for selecting either one of the two data input thereto.

The absolute value computation circuit 161 determines the difference (P–Q) of the data P and the data Q and also the difference (Q–P) of the data Q and the data P and select either the difference (P–Q) or the difference (Q–P), whichever showing a positive value. Then, it supplies the selected difference to the selector 168 as absolute value data |P–Q|.

The absolute value computation circuit 162 determines the difference R–S) of the data R and the data S and also the difference (S–R) of the data S and the data R and select either the difference R–S) or the difference (S–R), whichever showing a positive value. Then, it supplies the selected difference to the selector 168 as absolute value data |R–S|. The absolute value computation circuit 163 determines the difference (P–R) of the data P and the data R and also the difference R–P) of the data R and the data P and select either the difference (P–R) or the difference R–P), whichever showing a positive value. Then, it supplies the selected difference to the selector 169 as absolute value data |P–R|.

The absolute value computation circuit 164 determines the difference (Q–R) of the data Q and the data R and also the difference R–Q) of the data R and the data Q and select either the difference (Q–R) or the difference R–Q), whichever showing a positive value. Then, it supplies the selected difference to the selector 169 as absolute value data |Q–R|.

The absolute value computation circuit 165 determines the difference (P– S) of the data P and the data S and also the difference (S–P) of the data S and the data P and select either the difference (P–S) or the difference (S–P), whichever showing a positive value. Then, it supplies the selected difference to the selector 169 as absolute value data |P–S|.

The absolute value computation circuit 166 determines the difference (Q–S) of the data Q and the data S and also the difference (S–Q) of the data S and the data Q and select either the difference (Q–S) or the difference (S–Q), whichever showing a positive value. Then, it supplies the selected difference to the selector 169 as absolute value data |Q–S|.

The selector 167 selects one of the four pieces of information on the outcome of comparison as supplied from the comparator circuits 133, 134, 135, 136 of the path selecting section 130. Then, the selector 167 supplies the selected information on the outcome of comparison to the selector 170. The information on the outcome of comparison as selected by the selector 167 is identified as $C_4$ hereinafter.

The selector 168 selects either the absolute value data |P–Q| or the absolute value data |R–S| fed respectively from the absolute value computation circuits 161 and 162 on the basis of the information $C_3$ on the outcome of comparison fed from the selector 141 of the path selecting section 130. Then, the selector 168 supplies the selected absolute value data to the selector 170.

The selector 169 selects one of the absolute value data |P–R|, |Q–R|, |P–S| and |Q–S| fed respectively from the absolute value computation circuits 163, 164, 165, 166 on the basis of the information $C_1$ and the information $C_2$ on the outcome of comparison fed respectively from the comparator circuits 131 and 132 of the path selecting section 130. Then, the selector 169 supplies the selected absolute value data to the selector 170.

The selector 170 selects either the absolute value data fed from the selector 168 or the absolute value data fed from the selector 169 on the basis of the information $C_4$ on the outcome of comparison fed from the selector 167 and outputs it as absolute value data to be used for the computation of the correction term.

Thus, the absolute value data selecting section 160 can compare the absolute value data computed by the absolute value computation circuits 161, 162, 163, 164, 165, 166 to see which is larger on the basis of the information on the outcome of comparison obtained by the comparator circuits 133, 134, 135, 136 of the path selecting section 130 so that it can determine the absolute value of the difference between the data corresponding to the maximum likelihood path and the data corresponding to the second maximum likelihood path. For instance, if the results of the tournament promoted by the path selecting circuit 130 are such as those shown in FIG. 22 and hence the information $C_1$, the information $C_2$ and the information $C_3$ on the outcome of comparison indicate $P \leq Q$, $R \leq S$, $P \leq R$ respectively, the information $C_4$ on the outcome of comparison selected by the selector 167 is the same as the information $C_4$ on the outcome of comparison output from the comparator circuit 134 and the absolute value data selected by the selector 168 is the same as the absolute value data |P-Q| output from the absolute value computation circuit 161, while the absolute value data selected by the selector 169 is the same as the absolute value data |P-R| output from the absolute value computation circuit 163. Therefore, if the information $C_4$ on the outcome of comparison selected by the selector 167 indicates $Q \leq R$, the absolute value data selecting section 160 selects and outputs the absolute value data |P-Q| by means of the selector 170. On the other hand, if the information $C_4$ on the outcome of comparison selected by the selector 167 indicates $Q > R$, the absolute value data selecting section 160 selects and outputs the absolute value data. |P-R| by means of the selector 170.

As described above, the absolute value data selecting section 160 only needs to select the information $C_4$ on the outcome of comparison by means of the selector 167 according to each result of the tournament. Since there are four participants of the data P, the data Q, the data R and the data S competing in the tournaments, the absolute value data selecting section 160 selects the information $C_4$ on the outcome of comparison for the results of eight different possible matches as shown in FIG. 25 by means of the selector 167.

Firstly, if the data P is selected as the data corresponding to the maximum likelihood path and either of the data Q or the data R surrounded by a circle is selected as the data corresponding to the second maximum likelihood path as shown in (A) of FIG. 25, the selector 167 selects the information on the outcome of the comparison conducted on the data Q and the data R and output from the comparator circuit 134, showing which is larger, the data Q or the data R, as the information $C_4$ on the outcome of comparison. Then, the information $C_1$, the information $C_2$ and the information $C_3$ on the outcome of comparison obtained by the path selecting section 130 indicate respectively $P \leq Q$, $R \leq S$ and $P \leq R$.

Now, if the data R is selected as the data corresponding to the maximum likelihood path and either of the data P or the data S surrounded by a circle is selected as the data corresponding to the second maximum likelihood path as shown in (B) of FIG. 25, the selector 167 selects the information on the outcome of the comparison conducted on the data P and the data S and output from the comparator circuit 135, showing which is larger, the data P or the data S, as the information $C_4$ on the outcome of comparison. Then, the information $C_1$, the information $C_2$ and the information $C_3$ on the outcome of comparison obtained by the path selecting section 130 indicate respectively $P \leq Q$, $R \leq S$ and $P > R$.

Then, if the data P is selected as the data corresponding to the maximum likelihood path and either of the data Q or the data S surrounded by a circle is selected as the data corresponding to the second maximum likelihood path as shown in (C) of FIG. 25, the selector 167 selects the information on the outcome of the comparison conducted on the data Q and the data S and output from the comparator circuit 136, showing which is larger, the data Q or the data S, as the information $C_4$ on the outcome of comparison. Then, the information $C_1$, the information $C_2$ and the information $C_3$ on the outcome of comparison obtained by the path selecting section 130 indicate respectively $P \leq Q$, $R > S$ and $P \leq S$.

Similarly, if the data S is selected as the data corresponding to the maximum likelihood path and either of the data P or the data R surrounded by a circle is selected as the data corresponding to the second maximum likelihood path as shown in (D) of FIG. 25, the selector 167 selects the information on the outcome of the comparison conducted on the data P and the data R and output from the comparator circuit 133, showing which is larger, the data P or the data R, as the information $C_4$ on the outcome of comparison. Then, the information $C_1$, the information $C_2$ and the information $C_3$ on the outcome of comparison obtained by the path selecting section 130 indicate respectively $P \leq Q$, $R > S$ and $P > S$.

Likewise, if the data Q is selected as the data corresponding to the maximum likelihood path and either of the data P or the data R surrounded by a circle is selected as the data corresponding to the second maximum likelihood path as shown in (E) of FIG. 25, the selector 167 selects the information on the outcome of the comparison conducted on the data P and the data R and output from the comparator circuit 133, showing which is larger, the data P or the data R, as the information $C_4$ on the outcome of comparison. Then, the information $C_1$, the information $C_2$ and the information $C_3$ on the outcome of comparison obtained by the path selecting section 130 indicate respectively $P > Q$, $R \leq S$ and $Q \leq R$.

By the same token, if the data R is selected as the data corresponding to the maximum likelihood path and either of the data Q or the data S surrounded by a circle is selected as the data corresponding to the second maximum likelihood path as shown in (F) of FIG. 25, the selector 167 selects the information on the outcome of the comparison conducted on the data Q and the data S and output from the comparator circuit 136, showing which is larger, the data Q or the data S, as the information $C_4$ on the outcome of comparison. Then, the information $C_1$, the information $C_2$ and the information $C_3$ on the outcome of comparison obtained by the path selecting section 130 indicate respectively $P > Q$, $R \leq S$ and $Q > R$.

Furthermore, if the data Q is selected as the data corresponding to the maximum likelihood path and either of the data P or the data S surrounded by a circle is selected as the data corresponding to the second maximum likelihood path as shown in (G) of FIG. 25, the selector 167 selects the information on the outcome of the comparison conducted on the data P and the data S and output from the comparator circuit 135, showing which is larger, the data P or the data S, as the information $C_4$ on the outcome of comparison. Then, the information $C_1$, the information $C_2$ and the information $C_3$ on the outcome of comparison obtained by the path selecting section 130 indicate respectively P>Q, R>S and Q≦S.

Finally, if the data S is selected as the data corresponding to the maximum likelihood path and either of the data Q or the data R surrounded by a circle is selected as the data corresponding to the second maximum likelihood path as shown in (H) of FIG. 25, the selector 167 selects the information on the outcome of the comparison conducted on the data Q and the data R and output from the comparator circuit 134, showing which is larger, the data Q or the data R, as the information $C_4$ on the outcome of comparison. Then, the information $C_1$, the information $C_2$ and the information $C_3$ on the outcome of comparison obtained by the path selecting section 130 indicate respectively P>Q, R>S and Q>S.

When an ordinary selector is used for the selector 167 that is adapted to operate in the above described manner, a new tournament has to be promoted in order to select appropriate information on the outcome of comparison so that the absolute value data selecting section 160 comes to involve additional delay.

However, the absolute value data selecting section 160 can realize the selecting operation of the selector 167, utilizing the logical operations as shown below in place of the use of the selector 167.

Firstly, the selector 170 adapted to select data on the basis of the information $C_4$ on the outcome of comparison actually selects the data fed from the selector 168 which is the data on the first round matches of the tournament when the information $C_4$ on the outcome of comparison indicates P≦R, Q≦R, P≦S or Q≦S, whereas it actually selects the data fed from the selector 169 which is the data on the possible final round matches of the tournament when the information $C_4$ on the outcome of comparison indicates P>R, Q>R, P>S or Q>S. If the information $C_4$ on the outcome of comparison indicating P≦R, Q≦R, P≦S or Q≦S is denoted by "1" and the data on the first round of the tournament fed from the selector 168 is denoted by "$\Delta_{1st}$", while the data on the possible final round matches of the tournament fed from the selector 169 is denoted by "$\Delta_{final}$", the equivalence relation expressed by formula (34) below holds true. In formula (34), "∧" denotes AND, "∨" denotes OR and "¬" denotes negation.

$$C_4 1 \Leftrightarrow \Delta_{1st} \leq \Delta_{final}$$
$$\Leftrightarrow \{\min(P,Q) \leq \min(R,S) \wedge \max(P,Q) \leq \min(R,S)\}$$
$$\vee \{\min(R,S) \leq \min(P,Q) \wedge \max(R,S) \leq \min(P,Q)\}$$
$$\Leftrightarrow \{\max(P,Q) \leq \min(R,S)\} \vee \{\max(R,S) \leq \min(P,Q)\} \Leftrightarrow (P \leq R \wedge Q \leq R \wedge P \leq S \wedge Q \leq S)$$
$$\vee (R \leq P \wedge R \leq Q \wedge S \leq P \wedge S \leq Q)$$
$$\Leftrightarrow (P \leq R \wedge Q \leq R \wedge P \leq S \wedge Q \leq S)$$
$$\vee (\neg(P \leq R) \wedge \neg(Q \leq R) \wedge \neg(P \leq S) \wedge \neg(Q \leq S)) \quad (34)$$

In the above formula (34), the second row indicates a case where the data P or the data Q corresponds to the maximum likelihood path and the third row indicates a case where the data R or the data S corresponds to the maximum likelihood path. Additionally, in the above formula (34), min (•, •) denotes a function for selecting the smaller of two values and max (•, •) denotes a function for selecting the larger of two values. Thus, in the formula (34) above, max (P, Q) in the fourth row indicates the loser of the first round match of the tournament, or the larger value, of the data P and the data Q and min (P, Q) indicates the winner of the first round match of the tournament, or the smaller value, of the data P and the data Q, whereas min (R, S) indicates the winner of the first round match of the tournament, or the smaller value, of the data R and the data S and max (R, S) indicates the loser of the first round match of the tournament, or the larger value, of the data R and the data S.

Figure 26:
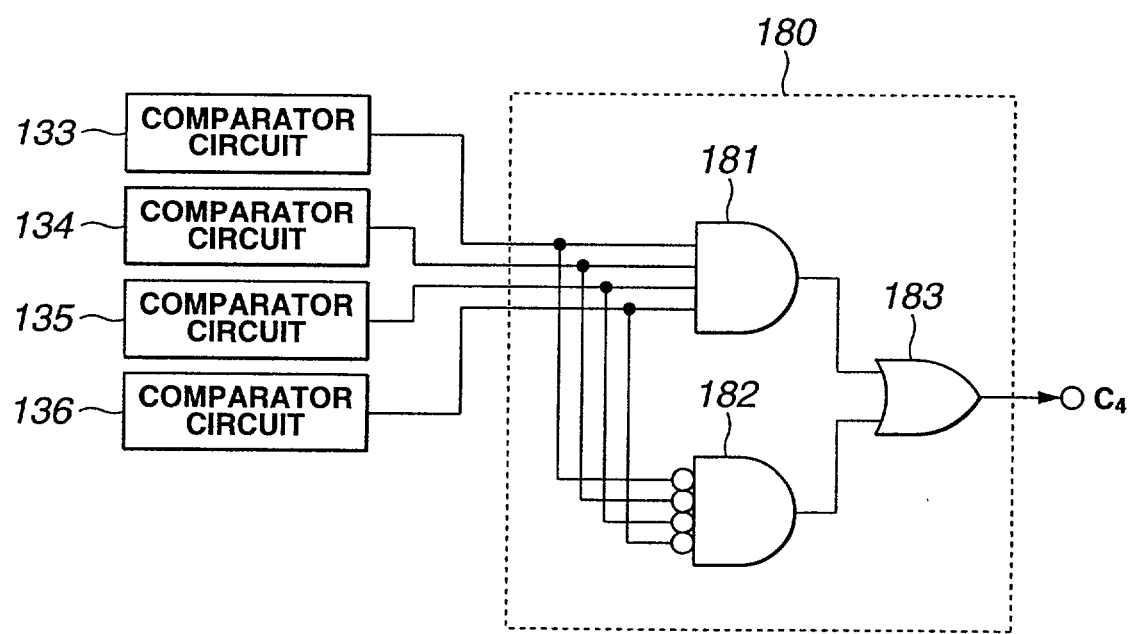
FIG. 26 is a schematic block diagram of the selecting section of the absolute value selecting section; illustrating the configuration thereof.

Since the above equivalence relation holds true, the absolute value data selecting section 160 can have the configuration as shown in FIG. 26 so as to realize its selecting operation by means of selector 167. Referring to FIG. 26, the selecting section 180 can be made to comprise an AND gate 181, a NAND gate 182 and an OR gate 183.

The AND gate 181 gives the logical product of the four pieces information on the outcome of comparison fed from the comparator circuits 133, 134, 135, 136. Then, the AND gate 181 supplies its logical product to the OR gate 183.

The NAND gate 182 gives the negation of the logical product of the four pieces information on the outcome of comparison fed from the comparator circuits 133, 134, 135, 136. Then, the NAND gate 182 supplies its negation of the logical product to the OR gate 183.

The OR gate 183 gives the logical sum of the logical product fed from the AND gate 181 and the negation of the logical product fed from the NAND gate 182. Then, the OR gate 183 supplies its logical sum to the selector 170 as information $C_4$ on the outcome of comparison.

Thus, the selecting section 180 selects one of the four pieces of information on the outcome of comparison fed from the comparator circuits 133, 134, 135, 136 and supplies the selected piece of information on the outcome of comparison to the selector 170 as information $C_4$ on the outcome of comparison.

The delay of the absolute value data selecting section 160 having the above described configuration is estimated to be equal to that of an adder and that of three adders because the delay of the absolute value computation circuits 161, 162, 163, 164, 165, 166 is equal to the delay of the above described absolute value computation circuit 90 and it additionally comprises an adder and a selector that give out delay. In other words, the absolute value data selecting section 160 involves only the delay of the absolute value computation circuits 161, 162, 163, 164, 165, 166 and that of two selectors. Therefore, the delay of the absolute value data selecting section 160 can be reduced if compared with the above described absolute value data selecting section 150.

Figure 27:
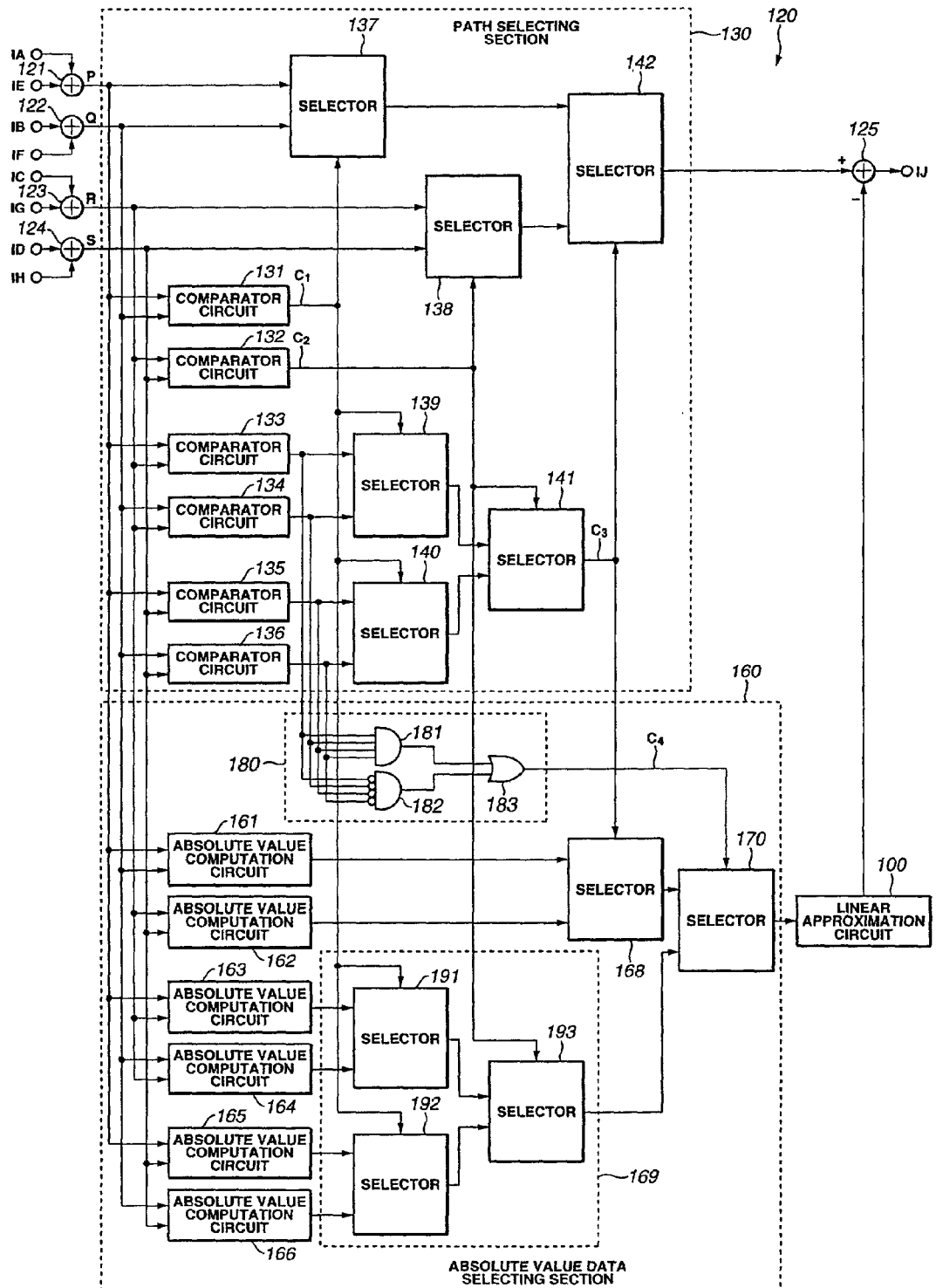
FIG. 27 is a schematic block diagram of an addition/comparison/selection circuit different from that of FIG. 14, illustrating the configuration of the circuit comprising both a path selecting section as shown in FIG. 20 and an absolute value data selecting section as shown in FIG. 24.

Thus, the addition/comparison/selection circuit 120 can be made to have a configuration as shown in FIG. 27, where the path selecting section 130 and the absolute value data selecting section 160 are combined.

Referring to FIG. 27, the addition/comparison/selection circuit 120 comprises adders 121, 122, 123, 124 that are equivalent to the adders 61, 62, 69, 70 of the above described addition/comparison/selection circuit 60, a path selecting section 130, an absolute value data selecting section 160, a linear approximation circuit 100 operating as linear approximation means in a manner as described above and a differentiator 125 corresponding to the differentiator 80 of the above described addition/comparison/selection 60 and adapted to determine the difference of the data fed from the path selecting section 130 and the data fed from the linear approximation circuit 100.

In the addition/comparison/selection circuit 120, the selector 169 of the absolute value data selecting section 160 actually comprises three selectors 191, 192, 193.

The selector 191 selects either the absolute value data |P−R| fed from the absolute value computation circuit 163 or the absolute value data |Q−R| fed from the absolute value computation circuit 164 on the basis of the information $C_1$ on the outcome of comparison fed from the comparator circuit 131. More specifically, the selector 191 selects the absolute value data |P−R| fed from the absolute value computation circuit 163 when it is found that P≦Q as a result of the comparison of the comparator circuit 131 but selects the absolute value data |Q−R| fed from the absolute value computation circuit 164 when it is found that P>Q holds true. Then, the selector 191 supplies the selected absolute value data to the selector 193.

The selector 192 selects either the absolute value data |P−S| fed from the absolute value computation circuit 165 or the absolute value data |Q−S| fed from the absolute value computation circuit 166 on the basis of the information $C_1$ on the outcome of comparison fed from the comparator circuit 131. More specifically, the selector 192 selects the absolute value data |P−S| fed from the absolute value computation circuit 165 when it is found that P≦Q as a result of the comparison of the comparator circuit 131 but selects the absolute value data |Q−S| fed from the absolute value computation circuit 166 when it is found that P>Q holds true. Then, the selector 192 supplies the selected absolute value data to the selector 193.

Finally, the selector 193 selects either of the absolute value data fed from the selector 191 or the absolute value data fed from the selector 192 on the basis of the information $C_2$ on the outcome of comparison fed from the comparator circuit 132. More specifically, the selector 193 selects the absolute value data fed from the selector 191 when it is found that R≦S as a result of the comparison of the comparator circuit 132 but selects the absolute value data fed from the selector 192 when it is found that R>S holds true. Then, the selector 193 supplies the selected absolute value data to the selector 170.

The addition/comparison/selection circuit 120 involves the delay of four adders and six selectors if it comprises a linear approximation circuit 100 as shown in FIG. 17 and that of three adders and six selectors if it comprises a linear approximation circuit 100 as shown in FIG. 18 because the processing operations of the comparator circuits 131, 132, 133, 134, 135, 136 and those of the absolute value computation circuits 161, 162, 163, 164, 165, 166 are carried out concurrently along with the processing operations of the selectors 137, 139, 140, 191, 192 and those of the selectors 138, 141, 193. Thus, the delay of the addition/comparison/selection circuit 120 is smaller than that of the addition/comparison/selection 60.

As described above, a data transmission/reception system comprising an encoder 1 and a decoder 3 can be made to operate quickly and realize high a speed operations when the decoder 3 applies the principle of tournament to a plurality input data in order to select the maximum likelihood path and compute the absolute value data to be used for computing the value of the correction term. Particularly, the decoder 3 can improve the operation speed without sacrificing the performance by doing a log-sum correction by means of linear approximation only between the maximum likelihood path and the second maximum likelihood path.

Thus, such a data transmission/reception system comprising an encoder 1 and a decoder 3 can decode convolutional codes highly effectively at high speed to provide the user with an enhanced level of reliability and convenience.

The present invention is by no means limited to the above described embodiment. For instance, the encoder may not be adapted to convolutional operations so long as it operates with an input data of two or more than two bits and hence can make three or more than three paths get to each state.

While four paths gets to each state and the maximum likelihood path and the second maximum likelihood path are selected out of the four paths and used for correction in the above described embodiment, the present invention can apply to any arrangement where two or more than two high likelihood paths are selected out of a number of paths getting to each state and used for correction.

Additionally, while log soft-outputs are obtained by means of MAP decoding using the Log-BCJR algorithm and log-sum correction using linear approximation in the above described embodiment, the present invention is applicable to any arrangement for MAP decoding using the. Max-Log-BCJR algorithm and hence adapted to high speed operations. Then, the addition/comparison/selection circuit does not need to comprise an absolute value computing section and a linear approximation circuit and is only required to have an arrangement for determining the maximum likelihood path.

Additionally, the present invention is applicable to any arrangement for decoding codes formed by concatenating a plurality element codes such as parallel concatenated convolutional codes, series concatenated convolutional codes, codes of a Turbo-coding modulation system or codes of a series concatenated coding modulation system.

While the encoder and the decoder of the above described embodiment are applied respectively to the transmitter and the receiver of a data transmission/reception system, the present invention can also be applied to a recording and/or reproduction device adapted to recording data to and/or reproducing data from a recording medium such as a magnetic, optical or magneto-optical disc, which may be a floppy disc, a CD-ROM or a MO (magneto-optical) disc. Then, the data encoded by the encoder are recorded on a recording medium that is equivalent to a memoryless communication channel and then decoded and reproduced by the decoder.

Thus, the above described embodiment can be modified and/or altered appropriately without departing from the scope of the invention.

What is claimed is:

1. A maximum likelihood decoder comprising:
   a first probability computing means for computing a logarithm of branch metric (γ), which is a logarithm of probability of a particular branch of a Trellis diagram, computed only based on the knowledge of input and output symbols associated with the particular branch;
   a second probability computing means for computing a logarithm of forward state metric (α), which is a logarithm of probability of a particular state of the Trellis diagram, given the probabilities of states at previous time instances;
   a third probability computing means for computing a logarithm of backward state metric (β), which is a logarithm of probability of the particular state of the Trellis diagram, given the probabilities of states at future time instances,
   wherein each of said second probability computing means and said third probability computing means includes a path selection means, said path selection means including:
  a plurality of comparator circuits to perform comparison operation, and
  a plurality of selectors to perform selection operation; and
an absolute value selecting means, said absolute value selecting means including:
  a plurality of absolute value computation circuits to perform absolute value computation, and
  a plurality of selectors to perform selection operation,
wherein comparison operations within the path selecting means and absolute value computation within the absolute value selecting means are carried out concurrently in log likelihood computations, and selection processing operations performed within the path selecting means and absolute value selecting means are carried out concurrently in log likelihood computations, and
wherein said absolute value data selecting means compares said computed absolute value data to determine which is larger on the basis of information on the outcome of comparison obtained by a plurality of said comparator circuits, and
wherein said path selection means operates to generate corrections to said probability of the particular state of the Trellis diagram using at least two paths, one path showing a maximum likelihood and another path showing a second maximum likelihood, from at least three paths in the Trellis diagram; and
a soft-output determining means for determining a log soft-output logarithmically expressing a soft-output in each time slot, given said forward and backward state metrics as well as said branch metric.

2. The decoder according to claim 1, wherein each of said plurality of comparator circuits includes
  a log likelihood comparator for comparing log likelihood of all combinations of said at least two paths selected from said at least three paths.

3. The decoder according to claim 2, wherein each of said plurality of absolute value computation circuits includes
  a computation means for computing absolute values of the difference of said at least two paths selected from said at least three paths.

4. The decoder according to claim 3, wherein each of said plurality of selectors includes
  an absolute value selection means for selecting an absolute value of the difference between data corresponding to a maximum likelihood path and data corresponding to a second maximum likelihood path selected from said at least three paths.

5. The decoder according to claim 4, further comprising:
  a linear approximation means for computing by linear approximation a correction term added to obtain said log likelihood and expressed by a one-dimensional function relative to a variable, said linear approximation means using said variable as an absolute value of the difference between data corresponding to said maximum likelihood path and fed from said absolute value selection means and data corresponding to said second maximum likelihood path.

6. The decoder according to claim 5, wherein said linear approximation means computes said correction term by expressing a coefficient representing the gradient of said one-dimensional function for multiplying said variable at least by means of a power exponent of 2.

7. The decoder according to claim 6, wherein said linear approximation means discards lower bits of an input data according to the power exponent expressing the coefficient representing the gradient of said function.

8. The decoder according to claim 6, wherein said linear approximation means discards bits from the lowest bit to the k-th lowest bit of the input data when the coefficient representing the gradient of said function is expressed by $-2^{-k}$.

9. The decoder according to claim 6, wherein said linear approximation means computes said correction term by expressing the coefficient representing an intercept of said function by means of a power exponent of 2.

10. The decoder according to claim 9, wherein said linear approximation means computes said correction term by expressing the coefficient representing the intercept of said function by means $2^m-1$.

11. The decoder according to claim 10, wherein said linear approximation means discards bits from the lowest bit to the k-th lowest bit of the n-bit input data and inverts m bits from the k+1-th lowest bit to the m+k-th lowest bit when the coefficient representing the gradient of said function is expressed by means of $-2^{-k}$.

12. The decoder according to claim 6, wherein said correction term shows a positive value.

13. The decoder according to claim 12, wherein said linear approximation means makes the correction term equal to 0 when a negative value is produced by computing said correction term.

* * * * *